(12) United States Patent
Kawanami et al.

(10) Patent No.: US 8,697,242 B2
(45) Date of Patent: Apr. 15, 2014

(54) GLASS MEMBER PROVIDED WITH SEALING MATERIAL LAYER, ELECTRONIC DEVICE USING IT AND PROCESS FOR PRODUCING THE ELECTRONIC DEVICE

(75) Inventors: Sohei Kawanami, Tokyo (JP); Atsuo Hiroi, Koriyama (JP)

(73) Assignee: Asahi Glass Company, Limited, Tokyo (JP)

( * ) Notice: Subject to any disclaimer, the term of this patent is extended or adjusted under 35 U.S.C. 154(b) by 70 days.

(21) Appl. No.: 13/341,188

(22) Filed: Dec. 30, 2011

(65) Prior Publication Data
US 2012/0147538 A1  Jun. 14, 2012

Related U.S. Application Data

(63) Continuation of application No. PCT/JP2010/061075, filed on Jun. 29, 2010.

(30) Foreign Application Priority Data

Jun. 30, 2009 (JP) .................................. 2009-154954
Jan. 27, 2010 (JP) .................................. 2010-015143

(51) Int. Cl.
B32B 15/04 (2006.01)
B32B 17/06 (2006.01)
H05B 6/02 (2006.01)
B05D 3/06 (2006.01)

(52) U.S. Cl.
USPC ........... 428/426; 428/428; 428/432; 428/688; 428/689; 428/697; 428/699; 428/701; 428/702; 427/402; 427/554

(58) Field of Classification Search
USPC ......... 428/426, 428, 432, 701, 702, 688, 689, 428/697, 699; 427/554, 402
See application file for complete search history.

(56) References Cited

U.S. PATENT DOCUMENTS 5,346,863 A * 9/1994 Hikata et al. .................... 501/17
5,714,840 A   2/1998 Tanabe et al.
(Continued)

FOREIGN PATENT DOCUMENTS

CN    101009319         8/2007
CN    101060131 (A)     10/2007
(Continued)

OTHER PUBLICATIONS

International Search Report issued Aug. 24, 2010 in PCT/JP2010/061075 filed Jun. 29, 2010.

(Continued)

*Primary Examiner* — David Sample
*Assistant Examiner* — Lauren Colgan
(74) *Attorney, Agent, or Firm* — Oblon, Spivak, McClelland, Maier & Neustadt, L.L.P.

(57) ABSTRACT

The invention provides a glass member provided with a sealing material layer, which suppresses generation of failures such as cracks or breakage of glass substrates or a sealing layer even when the distance between two glass substrates is narrowed, and thereby makes it possible to improve the sealing property between the glass substrates and its reliability. A glass substrate has a surface provided with a sealing region, on which a sealing material layer having a thickness of at most 15 μm is formed. The sealing material layer includes a fired material of a glass material for sealing containing a sealing glass, a laser absorbent and optionally a low-expansion filler, wherein the total content of the laser absorbent and the low-expansion filler being the optional component in the glass material for sealing is within the range of from 2 to 44 vol %.

15 Claims, 2 Drawing Sheets

(56) References Cited

U.S. PATENT DOCUMENTS

| | | | |
|---|---|---|---|
| 6,355,586 B1* | 3/2002 | Usui et al. | 501/45 |
| 6,998,776 B2* | 2/2006 | Aitken et al. | 313/512 |
| 7,291,573 B2* | 11/2007 | Ide | 501/50 |
| 7,439,201 B2* | 10/2008 | Drake et al. | 501/15 |
| 8,133,829 B2* | 3/2012 | Ide | 501/17 |
| 8,287,995 B2* | 10/2012 | Shibuya et al. | 428/213 |
| 8,349,751 B2* | 1/2013 | Nagai et al. | 501/70 |
| 8,490,434 B2* | 7/2013 | Watanabe et al. | 65/155 |
| 2003/0228471 A1* | 12/2003 | Hayakawa et al. | 428/426 |
| 2004/0207314 A1* | 10/2004 | Aitken et al. | 313/504 |
| 2005/0231118 A1* | 10/2005 | Fujimine et al. | 313/586 |
| 2006/0105898 A1* | 5/2006 | Ide | 501/50 |
| 2007/0128966 A1* | 6/2007 | Becken et al. | 445/25 |
| 2007/0286973 A1* | 12/2007 | Sawai et al. | 428/34.4 |
| 2008/0124558 A1* | 5/2008 | Boek et al. | 428/427 |
| 2008/0238316 A1* | 10/2008 | Hayashibara et al. | 313/582 |
| 2009/0199897 A1* | 8/2009 | Naito et al. | 136/256 |
| 2009/0247385 A1* | 10/2009 | Ide | 501/18 |
| 2010/0180934 A1* | 7/2010 | Naito et al. | 136/252 |
| 2011/0209813 A1* | 9/2011 | Shibuya et al. | 156/89.12 |
| 2011/0223360 A1* | 9/2011 | Shibuya et al. | 428/34 |
| 2011/0223371 A1* | 9/2011 | Kawanami | 428/76 |

FOREIGN PATENT DOCUMENTS

| | | |
|---|---|---|
| CN | 101454860 (A) | 6/2009 |
| JP | 2006-524419 | 10/2006 |
| JP | 2008-115057 | 5/2008 |
| JP | 2010-052990 | 3/2010 |
| WO | WO 2004/095597 | 11/2004 |
| WO | WO 2010/061853 | 6/2010 |
| WO | WO 2010/067848 | 6/2010 |
| WO | WO 2010/137667 | 12/2010 |

OTHER PUBLICATIONS

Chinese Office Action, Issued Oct. 22, 2013, with 8 page English Language Translation.

* cited by examiner

GLASS MEMBER PROVIDED WITH SEALING MATERIAL LAYER, ELECTRONIC DEVICE USING IT AND PROCESS FOR PRODUCING THE ELECTRONIC DEVICE

TECHNICAL FIELD

The present invention relates to a glass member provided with a sealing material layer, an electronic device using it and a process for producing the electronic device.

BACKGROUND ART

A flat panel display device (FPD) such as an organic EL (Electro-Luminescence) display (OELD), a plasma display panel (PDP) or a liquid crystal display device (LCD) has such a structure that a glass substrate for an element having a display element such as a light-emitting element formed and a glass substrate for sealing are disposed to face each other and the light-emitting element is sealed in a glass package comprising two such glass substrates that are sealed together (Patent Document 1). Also for a solar cell such as a dye-sensitized solar cell, application of a glass package having a solar cell element (photoelectronic conversion element) sealed with two glass substrates have been studied (Patent Document 2).

As a sealing material to seal a space between two glass substrates, application of sealing glass excellent in the moisture resistance, etc. is in progress. Since the sealing temperature of the sealing glass is at a level of from 400 to 600° C., properties of an electronic element portion of the OEL element or the dye-sensitized solar cell will be deteriorated when firing is conducted by using a conventional heating furnace. Accordingly, it has been attempted that a sealing material layer (a layer of a glass material for sealing) containing a laser absorbent is disposed between sealing regions provided on the peripheral portions of two glass substrates, and the layer is irradiated with a laser light to heat and melt the layer thereby to form a sealing layer (Patent Documents 1 and 2).

Sealing by laser irradiation (laser sealing) can suppress thermal influences over the electronic element portion, and on the contrary, it has a disadvantage that cracks, fractures and the like are likely to form on the glass substrate. One reason of the problem may be the difference in the thermal expansion coefficient between the glass substrate and the sealing glass. With respect to this point, Patent Document 2 describes a sealing material having a thermal expansion coefficient within $10 \times 10^{-7}$/° C. from that of the glass substrate. Since the thermal expansion coefficient of a sealing glass is larger than that of a glass substrate in general, besides a laser absorbent, a low-expansion filler such as silica, alumina, zirconia or cordierite is added to the sealing glass to obtain a sealing material having a low expansion coefficient.

By the way, reduction of the thickness of a glass package constituting e.g. a FPD or a solar cell tends to be in progress, and for this purpose, it is required to narrow the gap between the glass substrates to be, for example, at most 15 μm. Since e.g. the low-expansion filler is added to the sealing material as described above, it becomes necessary to reduce the particle size of the filler particles along with narrowing of the substrate distance. Reduction of the particle size of the filler particles causes increase of the specific surface area, and a sharing stress between the sealing glass melted by heat of the laser light and the filler particles increases to reduce fluidity. Accordingly, it becomes necessary to increase the process temperature (heating temperature) by the laser light, but when the process temperature is increased, a problem such that a crack or breakage etc. tends to occur in the glass substrates or the sealing layer.

PRIOR ART DOCUMENTS

Patent Documents

Patent Document 1: JP-A-2006-524419
Patent Document 2: JP-A-2008-115057

DISCLOSURE OF INVENTION

Technical Problem

It is an object of the present invention to provide a glass member provided with a sealing material layer which suppresses generation of failures such as cracks or breakage of the glass substrates or the sealing layer even in a case where the distance between two glass substrates is narrowed; an electronic device employing such a glass member provided with a sealing material layer and having high airtightness and reliability; and a process for producing such an electronic device.

Solution to Problem

The glass member provided with a sealing material layer according to an embodiment of the present invention comprises a glass substrate having a surface having a sealing region; and a sealing material layer having a thickness of at most 15 μm and formed on the sealing region of the glass substrate; wherein the sealing material layer comprises a fired material of a glass material for sealing containing a sealing glass, a laser absorbent and optionally a low-expansion filler, the total content of the laser absorbent and the low-expansion filler being an optional component being within the range of from 2 to 44 vol %; and wherein the difference between the thermal expansion coefficient $\alpha_1$ of the material of the sealing material layer and the thermal expansion coefficient $\alpha_2$ of the glass substrate is within the range of from 15 to $65(\times 10^{-7}$/° C.).

The electronic device according to an embodiment of the present invention comprises a first glass substrate having a surface having a first sealing region; a second glass substrate having a surface having a second sealing region corresponding to the first sealing region and disposed so that the surface is opposed to the surface of the first glass substrate; an electronic element portion provided between the first glass substrate and the second glass substrate; and a sealing layer formed between the first sealing region of the first glass substrate and the second sealing region of the second glass substrate to seal the electronic element portion and having a thickness of at most 15 μm; wherein the sealing layer comprises a melt-bonded layer of a glass material for sealing containing a sealing glass, a laser absorbent and optionally a low-expansion filler, the total content of the laser absorbent and the low-expansion filler being an optional component being within the range of from 2 to 44 vol %; and wherein the difference between the thermal expansion coefficient $\alpha_1$ of the material of the sealing layer and the thermal expansion coefficient $\alpha_2$ of at least one of the first glass substrate and the second glass substrate is within the range of from 15 to $65(\times 10^{-7}$/° C.).

The process for producing an electronic device according to an embodiment of the present invention comprises a step of preparing a first glass substrate having a surface having a first sealing region; a step of preparing a second glass substrate having a surface having a second sealing region corresponding to the first sealing region and provided with a sealing material layer having a thickness of at most 15 μm formed on the second sealing region; a step of laminating the first glass substrate and the second glass substrate with the sealing material layer interposed so that the surface of the first glass substrate and the surface of the second glass substrate are opposed to each other; and a step of irradiating the sealing material layer with a laser light through the first glass substrate or the second glass substrate to melt the sealing material layer thereby to form a sealing layer to seal the electronic element portion provided between the first glass substrate and the second glass substrate; wherein the sealing material layer comprises a fired material of a glass material for sealing containing a sealing glass, a laser absorbent and optionally a low-expansion filler, the total content of the laser absorbent and the low-expansion filler being an optional component being within the range of from 2 to 44 vol %; and wherein the difference of the thermal expansion coefficient $\alpha_1$ of the sealing material layer from the thermal expansion coefficient $\alpha_2$ of at least one of the first glass substrate and the second glass substrate is within the range of from 15 to $65(\times 10^{-7}/°C.)$.

Advantageous Effects of Invention

By the glass member provided with a sealing material layer, an electronic device employing it and a process for producing the electronic device according to an embodiment of the present invention, it is possible to suppress generation of e.g. cracks or breakage of glass substrates or a sealing layer at a time of laser sealing even in a case where the distance between two glass substrates is narrowed. Accordingly, it is possible to increase the sealing property between glass substrates and its reliability, and to provide an electronic device having high airtightness and reliability with good reproducibility.

DESCRIPTION OF EMBODIMENTS

Figure 1:
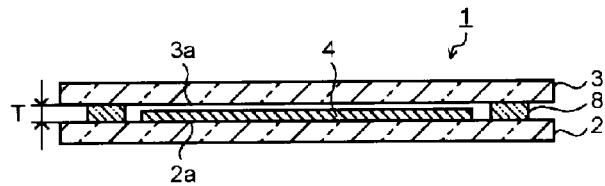
FIG. 1 is a cross-sectional view illustrating the construction of an electronic device according to an embodiment of the present invention.
Figure 2:
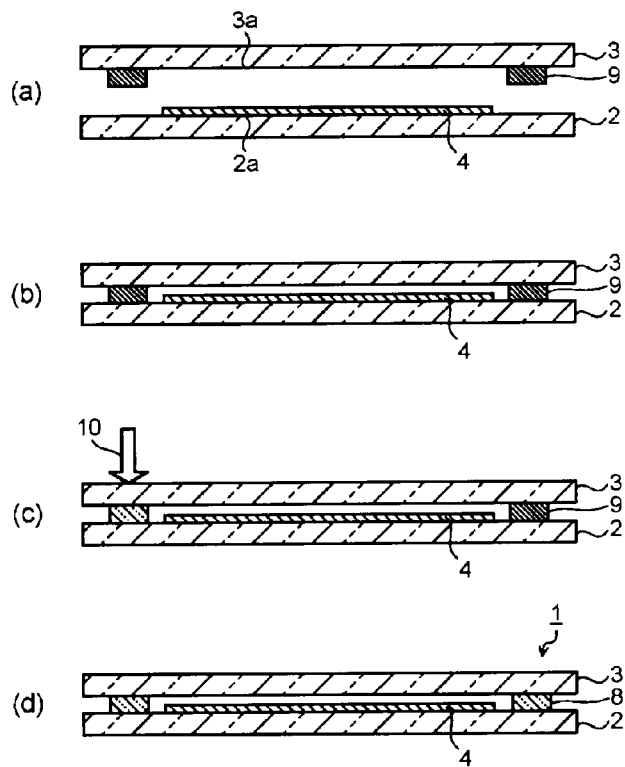
FIGS. 2(a) to 2(d) are cross-sectional views illustrating the procedure for production of an electronic device according to the embodiment of the present invention.
Figure 3:
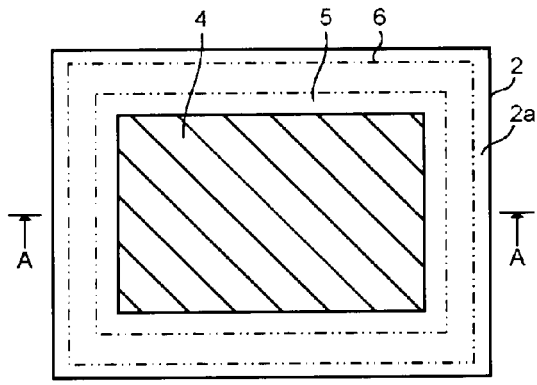
FIG. 3 is a plan view illustrating a first glass substrate used in the procedure for production of an electronic device shown in FIGS. 2(a) to 2(d).
Figure 4:
FIG. 4 is a cross-sectional view along the line A-A in FIG. 3.
Figure 5:
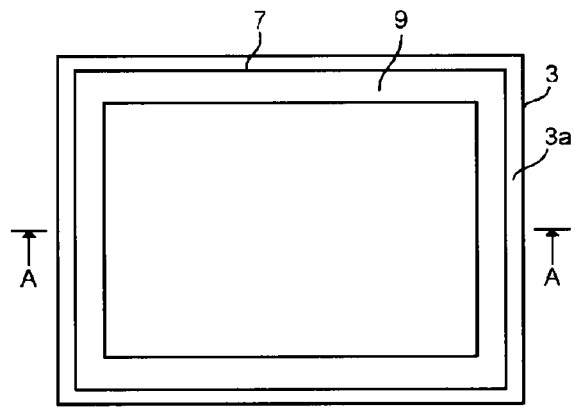
FIG. 5 is a plan view illustrating a second glass substrate used in the procedure for production of an electronic device shown in FIGS. 2(a) to 2(d).
Figure 6:
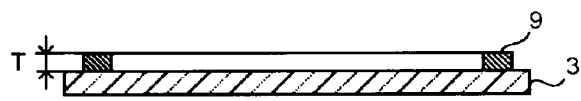
FIG. 6 is a cross-sectional view along the line A-A in FIG. 5.

Now, the embodiments of the present invention will be described with reference to drawings. FIG. 1 is a view illustrating the construction of an electronic device according to an embodiment of the present invention, FIGS. 2(a) to 2(d) are views illustrating the procedure for production of an electronic device according to the embodiment of the present invention, and FIGS. 3 and 4 are views illustrating the structures of a first glass substrate used therefore, and FIGS. 5 and 6 are views illustrating the structures of a second glass substrate used therefore.

An electronic device 1 shown in FIG. 1 constitutes a FPD such as an OELD, a PDP or a LCD, an illumination device (OEL illumination etc.) employing a light-emitting element such as an OEL element, or a solar cell such as a dye-sensitized solar cell. An electronic device 1 comprises a first glass substrate 2 and a second glass substrate 3. The first and second glass substrates 2 and 3 are constituted, for example, by alkali-free glass or soda lime glass etc. having a various known composition. Alkali-free glass has a thermal expansion coefficient of about from 35 to $40(\times 10^{-7}/°C.)$. Soda lime glass has a thermal expansion coefficient of about from 80 to $90(\times 10^{-7}/°C.)$.

Between a surface 2a of the first glass substrate 2 and a surface 3a of the second glass substrate 3 opposed thereto, an electronic element portion 4 according to the electronic device 1, is provided. The electronic element portion 4, for example, has an OEL element in a case of OELD or OEL illumination, a plasma emission element in a case of PDP, a liquid crystal display element in a case of LCD, and a dye-sensitized solar cell element (dye-sensitized photoelectric conversion element) in a case of solar cell. The electronic element portion 4 having a light-emitting element such as an OEL element or a dye-sensitized solar cell element etc., has any one of various known structures. The electronic device 1 of this embodiment is not limited to the element structure of the electronic element portion 4.

In the electronic device 1 shown in FIG. 1, the first glass substrate 2 constitutes a glass substrate for an element, and an element structure of e.g. an OEL element or a PDP element is formed as an electronic element portion 4 on a surface of the substrate. The second glass substrate 3 constitutes a glass substrate for sealing the electronic element portion 4 formed on the surface of the first glass substrate 2. However, the construction of the electronic device 1 is not limited thereto. For example, when the electronic element portion 4 is e.g. a dye-sensitized solar cell element, element films such as a wire films or electrode films forming element structures are formed on surfaces 2a and 3a of the first and second glass substrates 2 and 3. The element films constituting the electronic element portion and the element structure based on such films are formed on at least one of the surfaces 2a and 3a of the first and second substrates 2 and 3.

On the surface 2a of the first glass substrate 2 to be employed for production of the electronic device 1, as shown in FIGS. 3 and 4, a first sealing region 6 is provided along the outer periphery of an element region 5 in which the electronic element portion is formed. The first sealing region 6 is provided so as to surround the element region 5. On the surface 3a of the second glass substrate 3, as shown in FIGS. 5 and 6, a second sealing region 7 corresponding to the first sealing region 6 is provided. The first and second sealing regions 6 and 7 become forming regions of the sealing layer (the second sealing region 7 becomes a forming region of sealing material layer). Here, also on the surface 3a of the second glass substrate 3, an element region is provided as the case requires.

The first glass substrate 2 and the second glass substrate 3 are disposed with a predetermined gap so that the surface 2a having the element region 5 and the first sealing region 6 is opposed to the surface 3a having the second sealing region 7.

The gap between the first glass substrate 2 and the second glass substrate 3 is sealed by a sealing layer 8. Namely, the sealing layer 8 is formed between the sealing region 6 of the first glass substrate 2 and the sealing region 7 of the second glass substrate 3 so as to seal the electronic element portion 4. The electronic element portion 4 is hermetically sealed by a glass panel constituted by the first glass substrate 2, the second glass substrate 3 and the sealing layer 8. The sealing layer 8 has a thickness T of at most 15 μm.

In a case of applying e.g. an OEL element as the electronic element portion 4, partially, a space remains between the first glass substrate 2 and the second glass substrate 3. Such a space may remain as it is or the space may be filled with e.g. a transparent resin. The transparent resin may be bonded to the glass substrates 2 and 3 or it may be simply contact with the glass substrates 2 and 3. Further, in a case of applying e.g. a dye-sensitized solar cell element as the electronic element portion 4, the electronic element portion 4 is disposed in the entire gap between the first glass substrate 2 and the second glass substrate 3.

The sealing layer 8 comprises a melt-bonded layer formed by forming a sealing material layer 9 on the sealing region 7 of the second glass substrate 3 and melting the sealing material layer 9 by laser light to bond it to the sealing region 6 of the first glass substrate 2. Namely, in the sealing region 7 of the second glass substrate 3 to be employed for production of the electronic device 1, a frame-shaped sealing material layer 9 is formed as shown in FIGS. 5 and 6. The sealing material layer 9 formed in the sealing region 7 of the second glass substrate 3 is melt-bonded to the sealing region 6 of the first glass substrate 2 by heat of laser light, to thereby form a sealing layer 8 sealing a space (element-disposing space) between the first glass substrate 2 and the second glass substrate 3.

The sealing material layer 9 is a layer formed by firing a layer of a glass material for sealing formed in the sealing region 7 of the glass substrate 3. The glass material for sealing contains a sealing glass, a laser absorbent and optionally a low-expansion filler, and further, the glass material for sealing may contain an additive other than these components as the case requires. Hereinafter, the laser absorbent and the low-expansion filler are collectively referred to as a filler. The glass material for sealing contains the sealing glass and the filler, and may contain other additives as the case requires. As other additives, a filler other than the laser absorbent and the low-expansion filler may, for example, be mentioned. However, as described later, said other additives do not include a component disappearing at a time of firing. For the purpose of adjustment of expansion coefficient to be described later, the glass material for sealing preferably contains a low-expansion filler as the filler other than the laser absorbent.

For the sealing glass (glass frit), for example, low melting glass such as tin-phosphate glass, bismuth glass, vanadium glass or lead glass may be used. Among them, considering the sealing property (adhesion property) to the glass substrates 2 and 3 and reliability (bonding reliability and hermetical sealing property) and in addition, the influences over the environment and the human body, it is preferred to use sealing glass comprising tin-phosphate glass or bismuth glass.

The tin-phosphate glass (glass frit) preferably has a composition comprising from 20 to 68 mol % of SnO, from 0.5 to 5 mol % of $SnO_2$ and from 20 to 40 mol % of $P_2O_5$ (basically, the total amount will be 100 mol %). SnO is a component to make the glass have a low melting point. If the content of SnO is less than 20 mol %, the viscosity of glass will be high and the sealing temperature will be too high, and if the content exceeds 68 mass %, the glass will not be vitrified.

$SnO_2$ is a component to stabilize glass. If the content of $SnO_2$ is less than 0.5 mol %, $SnO_2$ will be separated and precipitate in the glass softened and melted at the time of the sealing operation, and the fluidity will be impaired and the sealing operation property will be decreased. If the content of $SnO_2$ exceeds 5 mol %, $SnO_2$ is likely to precipitate in the melt of the low melting glass. $P_2O_5$ is a component to form a glass skeleton. If the content of $P_2O_5$ is less than 20 mol %, the glass will not be vitrified, and if the content exceeds 40 mol %, deterioration of the weather resistance which is a drawback specific to phosphate glass may occur.

Here, the ratios (mol %) of SnO and $SnO_2$ in the glass frit can be determined as follows. First, the glass frit (low-melting glass powder) is subjected to acid decomposition, and then the total amount of Sn atoms contained in the glass frit is measured by ICP emission spectroscopy. Then, the amount of $Sn^{2+}$ (SnO) can be obtained by the iodometric titration after the acid decomposition, and thus the amount of $Sn^{4+}$ ($SnO_2$) is determined by subtracting the above obtained amount of $Sn^{2+}$ from the total amount of the Sn atoms.

The glass formed by the above three components has a low glass transition point and is suitable as a sealing material at low temperature, and it may contain e.g. a component to form a glass skeleton such as $SiO_2$, a component to stabilize the glass such as ZnO, $B_2O_3$, $Al_2O_3$, $WO_3$, $MoO_3$, $Nb_2O_5$, $TiO_2$, $ZrO_2$, $Li_2O$, $Na_2O$, $K_2O$, $Cs_2O$, MgO, CaO, SrO or BaO as an optional component. However, if the content of the optional component is too high, the glass will be unstable, whereby devitrification may occur, or the glass transition point or the softening point may be increased. Thus, the total content of the optional components is preferably at most 30 mol %. In this case, the glass composition is adjusted so that the total amount of the basic components and the optional components basically becomes 100 mol %.

The bismuth glass (glass frit) preferably has a composition comprising from 70 to 90 mass % of $Bi_2O_3$, from 1 to 20 mass % of ZnO and from 2 to 12 mass % of $B_2O_3$ (basically, the total content will be 100 mass %). $Bi_2O_3$ is a component to form a glass network. If the content of $Bi_2O_3$ is less than 70 mass %, the softening point of the low melting glass will be high, whereby sealing at low temperature will be difficult. If the content of $Bi_2O_3$ exceeds 90 mass %, the glass will hardly be vitrified and in addition, the thermal expansion coefficient tends to be too high.

ZnO is a component to lower the thermal expansion coefficient or the like. If the content of ZnO is less than 1 mass %, the glass will hardly be vitrified. If the content of ZnO exceeds 20 mass %, the stability at the time of formation of the low melting glass will be decreased, and devitrification is likely to occur. $B_2O_3$ is a component to form a glass skeleton and to broaden a range within which the glass can be vitrified. If the content of $B_2O_3$ is less than 2 mass %, the glass will hardly be vitrified, and if it exceeds 12 mass %, the softening point will be too high, whereby sealing at low temperature will be difficult even if a load is applied at the time of the sealing.

The glass formed by the above three components has a low glass transition point and is suitable as a sealing material at low temperature, and it may contain an optional component such as $Al_2O_3$, $CeO_2$, $SiO_2$, $Ag_2O$, $MoO_3$, $Nb_2O_5$, $Ta_2O_5$, $Ga_2O_3$, $Sb_2O_3$, $Li_2O$, $Na_2O$, $K_2O$, $Cs_2O$, CaO, SrO, BaO, $WO_3$, $P_2O_5$ or $SnO_x$ (wherein x is 1 or 2). However, if the content of the optional components is too high, the glass will be unstable, whereby devitrification may occur, or the glass transition point or the softening point may be increased. Thus, the total content of the optional components is preferably at most 30 mass %. In this case, the glass composition is adjusted so that the total amount of the basic components and the optional components basically becomes 100 mass %.

The glass material for sealing contains as the filler a laser absorbent and a low-expansion filler. However, since it is possible to obtain the function of filler by the laser absorber alone, the low-expansion filler is an optional component and the low-expansion filler is not necessarily contained. The laser absorbent is an essential component for melting the sealing material layer 9 being a fired layer of the glass material for sealing, by heat of laser light. Thus, the glass material for sealing contains besides the sealing glass, a laser absorbent as an essential component or both of the laser absorbent and the low-expansion filler.

As the laser absorbent, a compound such as at least one metal selected from Fe, Cr, Mn, Co, Ni and Cu or an oxide containing the metal, may be employed. Further, the laser absorbent may be a pigment other than them. As the low-expansion filler, at least one type selected from silica, alumina, zirconia, zirconium silicate, cordierite, a zirconium phosphate compound, soda lime glass and borosilicate glass, is preferably employed. As the zirconium phosphate compound, $(ZrO)_2P_2O_7$, $NaZr_2(PO_4)_3$, $KZr_2(PO_4)_3$, $Ca_{0.5}Zr_2(PO_4)_3$, $NbZr(PO_4)_3$, $Zr_2(WO_3)(PO_4)_2$ or a complex compound of them may, for example, be mentioned. The low-expansion filler is a filler having a thermal expansion coefficient lower than that of the sealing glass.

The glass material for sealing may contain another filler (for example, a filler having a thermal expansion coefficient equivalent or higher than the thermal expansion coefficient of the sealing glass) besides the laser absorbent the low-expansion filler. However, usually, use of such other fillers is not necessary. Hereinafter, the filler means the laser absorbent and the low-expansion filler, and e.g. the quantitative ratio of the filler means the ratio of total amount of the laser absorbent and the low-expansion filler unless otherwise specified.

The thickness T of the sealing material layer 9 is at most 15 μm or further at most 10 μm in order to narrow the substrate distance (the distance between the first glass substrate 2 and the second glass substrate 3) after sealing. The thickness T of the sealing material layer 9 depends on the structure of the electronic device 1, and it is preferably at least 1 μm for practical use. In order to form a sealing material layer 9 having such a thickness, it is required to miniaturize the particle size of the low laser absorbent for the low-expansion filler being the filler. Specifically, it is necessary to make the maximum particle size of the filler particles to be less than the thickness T of the sealing material layer 9. In conventional fillers, along with miniaturization of the maximum particle size, all filler particles tend to be miniaturized. Further, conventional glass materials for sealing contain relatively large amount of low-expansion filler in order to reduce the difference from the glass substrates 2 and 3 in the thermal expansion coefficient.

In such a glass material for sealing containing relatively large amount of low-expansion filler in fine particle state, since miniaturization of the particle size of the low-expansion filler increases the surface area as described above, the fluidity of the glass material for sealing decreases. In order to melt the glass material for sealing having a low fluidity by laser light, it is, for example, necessary to increase the output of laser light to raise the process temperature (heating temperature). However, when the process temperature by laser light is raised, cracks or breakage tends to be formed in the glass substrates 2 and 3 or the sealing layer 8.

Thus, in this embodiment, the amount of low-expansion filler to be added to the glass material for sealing is reduced. Specifically, the total content of the low-expansion filler and the laser absorbent in the glass material for sealing is set to be within the range of from 2 to 44 vol %. When the content of the low-expansion filler in the glass material for sealing is reduced, of course the difference between the thermal expansion coefficient $\alpha_1$ of the fired glass material for sealing and the thermal expansion coefficient $\alpha_2$ of the glass substrates 2 and 3 increases. Since the thermal expansion difference between the sealing material layer comprising this fired glass material for sealing and the glass substrates 2 and 3 is considered to be the main cause of cracks or breakage of the glass substrates 2 and 3 or the sealing layer 8, the conventional glass materials for sealing contain relatively large amount of low-expansion filler as described above.

Hereinafter the fired glass material for sealing being a material constituting the sealing material layer 9 may also be referred to as sealing material. The thermal expansion coefficient $\alpha_1$ of the sealing material may also be referred to as thermal expansion coefficient $\alpha_1$ of the sealing material layer.

Further, the sealing layer 8 is a layer comprising a melt-bonded material of the glass material for sealing or the material of sealing material layer 9 (fired glass material for sealing), and it is usually a layer formed by melting and cooling the sealing material layer 9. Even if the material of the sealing material layer 9 (sealing material) is once melted and cooled for sealing, the material of the sealing layer 8 and the material of the sealing material layer 9 are considered to be substantially not changed. Accordingly, the thermal expansion coefficient of the material of the sealing layer 8 equals to the thermal expansion coefficient $\alpha_1$ of the sealing material.

Cracks or breakage of the glass substrates 2 and 3 or the sealing layer 8 in a laser sealing step is caused by residual stress formed in the glass substrates 2 and 3 according to melting and solidification of the sealing material layer 9. When the thermal expansion coefficient $\alpha_1$ of the sealing material is larger than the thermal expansion coefficient $\alpha_2$ of the glass substrates 2 and 3, the shrinkage amount of the sealing material layer 9 is larger than the shrinkage amount of the glass substrates 2 and 3 in the laser sealing step (heating and cooling step), and a strong compressive stress (residual stress) is formed in the glass substrates 2 and 3. The residual stress σ formed in the glass substrates 2 and 3 is represented by the following formula.

$$\sigma = \alpha \cdot \Delta T \cdot E/(1-\nu) \quad (1)$$

In the above formula (1), α is the difference between the thermal expansion coefficient $\alpha_1$ of the sealing material and the thermal expansion coefficient $\alpha_2$ of the glass substrates 2 and 3, ΔT is the temperature difference at a time of laser sealing (temperature difference from the melting temperature (process temperature) of the sealing material layer 9 to a cooled room temperature) divided by cooling time, E is Young's modulus of the sealing material or the glass substrates 2 and 3, and ν is a Poisson's ratio. In a case of laser sealing, since the cooing time becomes substantially constant when the scanning speed and the spot size of laser light is constant, ΔT substantially becomes the temperature difference at the time of laser sealing.

In conventional glass materials for sealing, a method of reducing α in formula (1) of material after laser sealing step to reduce residual stress, has been mainly employed. With respect to such a point, it has become clear that when the thickness T of the sealing material layer 9 is reduced to be at most 15 μm and further to be at most 10 μm, influence of the value of ΔT increases. Namely, when the laser process temperature (heating temperature) is increased to increase the fluidity of sealing material, increase of the residual stress a becomes significant.

Figure 7:
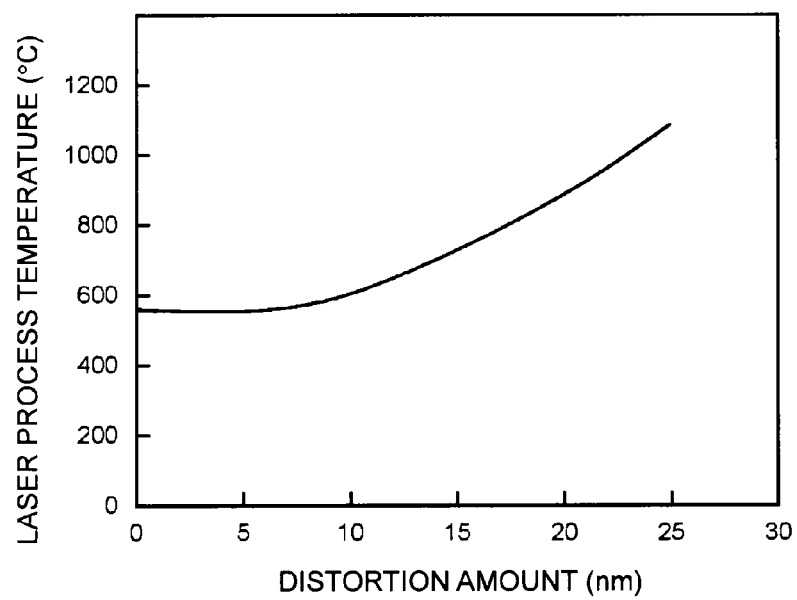
FIG. 7 is a view showing an example of the relation between the distortion amount of a glass substrate, that is laser-sealed by employing a sealing material layer having a thickness of at most 15 μm, and laser process temperature (heating temperature).

FIG. 7 shows an example of the relation between a strain amount of glass substrates that are laser-sealed by using a thin sealing material layer 9 having a thickness T of at most 15 μm, and the laser process temperature (heating temperature). As evident from FIG. 7, the strain amount of the glass substrates increases along with rise of the laser process temperature, which indicates that residual stress in the glass substrates is increased by laser sealing step (heating and cooling step). On the other hand, when the thickness T of the sealing material layer 9 is made to be as thin as at most 15 μm, since the influence of shrinkage amount of the sealing material layer 9 is reduced, the stress due to the difference of shrinkage amount (thermal expansion difference) between the glass substrates 2 and 3 and the sealing material layer 9 becomes small as compared with a case where the film thickness T of the sealing material layer 9 is thick.

Thus, when a thin sealing material layer 9 having a thickness T of at most 15 μm is employed, it is more important to suppress rise of laser process temperature than reduction of thermal expansion difference between the sealing material layer 9 and the glass substrates 2 and 3. The importance becomes further significant when the thickness T of the sealing material layer 9 is at most 10 μm. Thus, in this embodiment, in order to lower the laser process temperature, the total content (content of filler) of the low-expansion filler and the laser absorbent in the glass material for sealing is set to be within the range of from 2 to 44 vol %.

Fluidity of the sealing material is influenced not only by the low-expansion filler but also by the laser absorbent. For this reason, in this embodiment, the total content of the low-expansion filler and the laser absorbent in the glass material for sealing is set to be at most 44 vol %. When the total content of the low-expansion filler and the laser absorbent is at most 44 vol %, it is possible to obtain sufficient lowering effect of laser process temperature (heating temperature).

When the total content of the low-expansion filler and the laser absorbent is reduced, the thermal expansion difference between the sealing material layer 9 and the glass substrates 2 and 3 is increased particularly by the influence of reduction of the content of the low-expansion filler, but since the lowering of fluidity of the sealing material is suppressed, it is possible to lower the laser process temperature (heating temperature). Accordingly, residual stress in the glass substrates 2 and 3 caused by the laser sealing is reduced, and accordingly, it is possible to suppress cracks or breakage of the glass substrates 2 and 3 or the sealing layer 8.

The laser absorbent is an essential component for carrying out a laser sealing step, and the content is preferably within the range of from 2 to 10 vol % based on the glass material for sealing. When the content of the laser absorbent is less than 2 vol %, it may not be possible to sufficiently melt the sealing material layer 9 at a time of laser irradiation. This may cause poor bonding. On the other hand, if the content of laser absorbent exceeds 10 vol %, local heat generation in the vicinity of an interface with the second glass substrate 3 may occur at the time of laser irradiation to cause cracks in the second glass substrate 2, or fluidity of molten glass material for sealing may be deteriorated to deteriorate the bonding property with the first glass substrate 2.

The low-expansion filler is preferably contained to reduce the thermal expansion difference between the sealing material layer 9 and the glass substrates 2 and 3, but when the low-expansion filler has a particle size applicable to a thin sealing material layer 9 having a thickness T of at most 15 μm, the content is preferably reduced since the low-expansion filler may become a factor of lowering fluidity at a time of laser process. For this reason, the content of the low-expansion filler is preferably at most 40 vol % based on the glass material for sealing. If the content of the low-expansion filler exceeds 40 vol %, rise of the laser process temperature is unavoidable. The content of the low-expansion filler is practically within the range of at least 10 vol % but as described later, the glass material for sealing not necessarily contains the low-expansion filler in some cases.

Since the sealing material of this embodiment has a reduced content of low-expansion filler, the difference between the thermal expansion coefficient $\alpha_1$ of the sealing material layer 9 and the thermal expansion coefficient $\alpha_2$ of the glass substrates 2 and 3 is large. Specifically, the thermal expansion difference between the sealing material layer 9 and the glass substrates 2 and 3 is within the range of from 15 to $65(\times 10^{-7}/°$ C.). In other words, when the thermal expansion difference is within the range of from 15 to $65(\times 10^{-7}/°$ C.), it is possible to reduce the content of the low-expansion filler to maintain the fluidity of sealing material, and to lower the laser process temperature (heating temperature) based on the fluidity, thereby to suppress cracks or breakage of the glass substrates 2 and 3 or the sealing layer 8.

Here, the thermal expansion coefficient $\alpha_1$ of the sealing material layer 9 and the thermal expansion coefficient $\alpha_2$ of the glass substrates 2 and 3 are values measured by using a push-rod type thermal expansion coefficient measurement apparatus, and the temperature range for measuring the thermal expansion coefficients $\alpha_1$ and $\alpha_2$ is from 50 to 250° C. Further, the thermal expansion coefficient between the sealing material layer 9 and the glass substrates 2 and 3 is a value (($\alpha_1-\alpha_2$) or ($\alpha_2-\alpha_1$)) obtained by subtracting the smaller value from the larger value of the coefficients, and the large-small relation between the thermal expansion coefficient $\alpha_1$ of the sealing material layer 9 and the thermal expansion coefficient $\alpha_2$ of the glass substrates 2 and 3 may be any relation.

When the thermal expansion difference between the sealing material layer 9 and the glass substrates 2 and 3 is less than $15\times 10^{-7}/°$ C., the sealing material contains relatively large amount of low-expansion filler, and rise of the above-mentioned laser process temperature is unavoidable. If the thermal expansion coefficient between the sealing material layer 9 and the glass substrates 2 and 3 exceeds $65\times 10^{-7}/°$ C., by the influence of laser process temperature, an influence of the difference in the shrinkage amount between the glass substrates 2 and 3 and the sealing material layer 9 becomes large, whereby the cracks or breakage of the glass substrates 2 and 3 or the sealing layer 8 tends to occur even if the laser process temperature is lowered.

Thus, when the thermal temperature difference between the sealing material layer 9 and the glass substrates 2 and 3 is within the range of at most $65\times 10^{-7}/°$ C., it is possible to reduce the content of the low-expansion filler in the sealing material. Further, even in a case where the sealing material contains no low-expansion filler, when the thermal expansion difference between the sealing material layer 9 and the glass substrates 2 and 3 is at most $65\times 10^{-7}/°$ C., it is possible to suppress cracks or breakage, etc. of the glass substrates 2 and 3 or the sealing layer 8. It is sufficient that the sealing material contains a laser absorbent as a filler, and the content of the low-expansion filler may be zero. For this reason, it is sufficient that the total content of the low-expansion filler and the laser absorbent in the glass material for sealing is at least 2 vol % being the lower limit of the content of the laser absorbent.

Here, in order to reduce the difference in the shrinkage amount between the glass substrates 2 and 3 and the sealing material layer 9 at the time of laser sealing, the thermal expansion difference between the sealing material layer 9 and the glass substrates 2 and 3 is preferably at most $50 \times 10^{-7}/°$ C., more preferably at most $35 \times 10^{-7}/°$ C. From these points of view, the glass material for sealing preferably contains the low-expansion filler within the range of at least 10 vol %. When the sealing material is one produced by firing a glass material for sealing containing the laser absorbent within the range of from 2 to 10 vol % and the low-expansion filler within the range of from 10 to 40 vol %, it is possible to lower the laser process temperature while reducing the difference in the shrinkage amount between the glass substrates 2 and 3 and the sealing material layer 9 at the time of laser sealing, which contributes to improve the reliability of sealing property.

The fluidity of the sealing material and the laser process temperature to be set according to the fluidity, are influenced not only by the content of the filler (laser absorbent and/or low-expansion filler) in the sealing material but also by the particle shape of the filler. As described above, the maximum particle size of the filler particles needs to be less than the thickness T of the sealing material layer 9. Further, it is preferred to reduce the specific surface area of the filler particles. Specifically, the surface area of the filler in the glass material for sealing is preferably within the range of from 0.5 to 6 $m^2/cm^3$. The surface area of the filler in the glass material for sealing is a value represented by [(specific surface area of filler)×(specific gravity of filler)×(content of filler (vol %))]. For example, in a glass material for sealing containing a laser absorbent and a low-expansion filler, their total surface area in the glass material for sealing is represented by [(specific surface area of laser absorbent)×(specific gravity of laser absorbent)×(content of laser absorbent (vol %))+(specific surface area of low-expansion filler)×(specific weight of low-expansion filler)×(content of low-expansion filler (vol %))].

By making the surface area of the filler in the glass material for sealing to be within the range of from 0.5 to 6 $m^2/cm^3$, it is possible to further improve the fluidity of the sealing material and to further lower the laser process temperature. The surface area of the above filler particles can be satisfied by controlling the particle size distributions of the low-expansion filler and the laser absorbent. Specifically, the specific surface area can be obtained by classifying particles by a mesh or wind separation at a time of preparing the low-expansion filler or the laser absorbent.

The electronic device 1 of the above embodiment is prepared, for example, by the following process. First, as shown in FIGS. 2(*a*), 5 and 6, a sealing material layer 9 is formed on a sealing region 7 of a second glass substrate 3. In the step of forming the sealing material layer 9, first, a glass material for sealing is prepared so that the total content of a low-expansion filler and a laser absorbent is within the range of from 2 to 44 vol %, so as to form a sealing material layer having a thermal expansion difference from the glass substrates 2 and 3 within the range of form 15 to $65 \times 10^{-7}/°$ C.

The glass material for sealing comprises a composition containing a sealing glass, a laser absorbent and optionally a low-expansion filler and further containing additives other than them as the case requires. In the present invention, among additives, a solvent and a binder disappearing from the composition by evaporation or burning at a time of firing are not included in the constituent component of the glass material for sealing. The components disappearing from the composition by evaporation or burning at the time of firing are additives usually essential for forming a layer of the glass material for sealing on a surface of glass substrate by e.g. coating. However, since these disappearing components are not components constituting the sealing material, they are not included in the constituent components of the glass material for sealing, and the composition ratio of the constituent components is defined as a constituent ratio excluding these disappearing components. A composition for forming a layer to be a sealing material after firing, which contains the constituent components of the glass material for sealing and disappearing components such as a solvent and a binder, is hereinafter referred to as a sealing material paste.

The composition ratio of the components disappearing by firing is determined considering properties such as a coating property required to the sealing material paste as well as the composition ratio of the components remaining after the firing.

The sealing material paste is prepared by mixing the constituent components of the glass material for sealing and a vehicle. The vehicle is a material produced by dissolving a resin being a binder component in a solvent. The resin for vehicle may, for example, be an organic resin such as a cellulose resin such as methyl cellulose, ethyl cellulose, carboxymethyl cellulose, oxyethyl cellulose, benzyl cellulose, propyl cellulose or nitro cellulose; or an acrylic resin obtained by polymerizing at least one type of acrylic monomer such as methyl methacrylate, ethyl methacrylate, butyl methacrylate, 2-hydroxyethyl methacrylate, butyl acrylate or 2-hydroxyethyl acrylate. In the case of cellulose resin, the solvent may be terpineol, butylcarbitol acetate, ethylcarbitol acetate, etc., and in the case of acrylic resin, the solvent may be methylethyl ketone, terpineol, butylcarbitol acetate, ethylcarbitol acetate, etc.

The viscosity of the sealing material paste may be adjusted to the viscosity suitable for an apparatus for coating the glass substrate 3, and the viscosity may be adjusted by the ratio between the resin (binder component) and the solvent or the ratio between the component of the glass material for sealing and the vehicle. To the sealing material paste, additives such as defoaming agent or a dispersing agent, that are known as additives of glass paste, may be added. These additives are also components usually disappearing at a time of firing. For preparation of the sealing material paste, a known method using a rotation type mixer provided with a steering blade, a roll mill or a ball mill, etc. may be used.

The above sealing material paste is applied on the sealing region 7 of the second glass substrate 3, and dried to form a coating layer of the sealing material paste. The sealing material paste is applied so that the film thickness after firing becomes at most 15 μm. The sealing material paste is applied on the second sealing region 7 by using, for example, a printing method such as screen printing or gravure printing, or applied on the second sealing region 7 by using e.g. a disperser. The coating layer of the sealing material paste is preferably dried at a temperature of at least 120° C. for at least 10 minutes. The drying step is carried out to remove the solvent in the coating layer. If the solvent remains in the coating layer, components such as a binder, that are to be disappeared in the subsequent firing step, may not be sufficiently removed.

Next, the above coating layer of the sealing material paste is fired to form a sealing material layer 9. In the firing step, first, the coating layer is heated to a temperature of at most the glass transition point of the sealing glass (glass frit), to remove e.g. binder component in the coating layer, and thereafter, it is heated to a temperature of at least the softening temperature of the sealing glass (glass frit) to melt the glass material for sealing to bond it to the glass substrate 3. Thus, a sealing material layer 9 comprising a fired material of the glass material for sealing (sealing material) is formed on the sealing region 7 of the second glass substrate 3.

Next, a first glass substrate 2 is prepared separately from the second glass substrate 3, and using these glass substrates 2 and 3, an electronic device 1 such as a FPD such as an OELD, a PDP or an LCD, an illumination device employing an OEL element or a solar cell such as a dye-sensitized solar cell, is prepared. Namely, as shown in FIG. 2(*b*), the first glass substrate 2 and the second glass substrate 3 are laminated via the sealing material layer 9 so that the surfaces 2*a* and 3*a* of the substrates are opposed to each other. Between the first glass substrate 2 and the second glass substrate 3, a gap based on the thickness of the sealing material layer 9, is formed.

Next, as shown in FIG. 2(*c*), the sealing material layer 9 is irradiated with laser light 10 through the second glass substrate 3. Here, the sealing material layer 9 may be irradiated with the laser light 10 through the first glass substrate 2. The sealing material layer 9 is irradiated with the laser light 10 while the laser light 10 is scanned along the sealing material layer 9. Then, by irradiating the entire circumference of the sealing material layer 9 with the laser light 10, a sealing layer 8 sealing a gap between the first glass substrate 2 and the second glass substrate 3 is formed as shown in FIG. 2(*d*). The thickness of the sealing layer 8 becomes smaller than the thickness of the sealing material layer 9 but since the thickness of the sealing material layer 9 is as thin as at most 15 μm, the reduction of the thickness by laser sealing is small. Accordingly, the thickness of the sealing layer 8 becomes a thickness (at most 15 μm) approximately the same as the thickness of the sealing material layer 9.

Thus, an electronic device 1 is prepared, which comprises a glass panel constituted by the first glass substrate 2, the second glass substrate 3 and the sealing layer 8, and an electronic element portion 4 provided between the first glass substrate 2 and the second glass substrate 3 and hermetically sealed by the glass panel. Here, the glass panel of this embodiment is not limited to be used as a component of the electronic device 1, but it can be applied to a sealing member of an electronic component or a glass member (e.g. architectural member) such as a multilayer glass.

The laser light 10 is not particularly limited, and it may be a laser light emitted from a semiconductor laser, a carbonoxide gas laser, an excimer laser, a YAG laser, a HeNe laser, etc. The power of the laser light 10 is appropriately set according to e.g. the thickness of the sealing material layer 9, and it is, for example, preferably within the range of from 2 to 150 W. If the laser power is less than 2 W, the sealing material layer 9 may not be melted, and if it exceeds 150 W, cracks or breakage tends to be formed in the glass substrates 2 and 3. The power of the laser light 10 is more preferably within the range of from 5 to 100 W.

By the electronic device 1 of this embodiment and its production process, even when the thickness T of the sealing material layer 9 is reduced to be at most 15 μm to narrow the substrate distance, it is possible to reduce the residual stress of the glass substrates 2 and 3 at the time of laser sealing, whereby it is possible to suppress e.g. cracks or breakage in the glass substrates 2 and 3 or the sealing layer 8. Accordingly, it is possible to produce an electronic device 1 having a thin glass package with good yield, and to improve the sealing property and the hermetical sealing property of the electronic device 1 and their reliability.

By the way, in the above embodiment, explanation has been made mainly with respect to a case where the difference of the thermal expansion coefficient $\alpha_2$ of both of the first glass substrate 2 and the second glass substrate 3 from the thermal expansion coefficient $\alpha_1$ of the sealing material layer 9, is within the range of from 15 to 65($\times 10^{-7}$/° C.), but the construction of the glass substrates 2 and 3 is not limited thereto. When the difference of at least one thermal expansion coefficient of the thermal expansion coefficient $\alpha_{21}$ of the first glass substrate 2 and the thermal expansion coefficient $\alpha_{22}$ of the second glass substrate 3 from the thermal expansion coefficient $\alpha_1$ of the sealing material layer 9 is within the range of from 15 to 65($\times 10^{-7}$/° C.), it is possible to obtain the reduction effect of the residual stress by increase of fluidity by reduction of filler amount in the sealing material and by reduction of laser process temperature, that is, a suppression effect of cracks or breakage in the glass substrates 2 and 3 or the sealing layer 8.

When the first glass substrate 2 and the second glass substrate 3 comprise the same type of glass material, of course the difference of the thermal expansion coefficient $\alpha_{21}$ of the first glass substrate 2 and the thermal expansion coefficient $\alpha_{22}$ of the second glass substrate 3 from the thermal expansion coefficient $\Delta_1$ of the sealing material layer 9, becomes within the range of from 15 to 65×10$^{-7}$/° C. In such a case, in a step of melt-bonding the sealing material layer 9 to the first glass substrate 2 by heat of the laser light 10 (melt-bonding step of the sealing material layer 9 by laser light 10), it is possible to improve the adhesiveness between the first glass substrate 2 and the second glass substrate 3 and the sealing layer 8 and its reliability based on the reduction effect of the residual stress by e.g. lowering of the laser process temperature.

In a case where the first glass substrate 2 and the second glass substrate 3 comprise different type of glass materials, it is sufficient that the difference of at least one thermal expansion coefficient of the thermal expansion coefficient $\alpha_{21}$ of the first glass substrate 2 and the thermal expansion coefficient $\alpha_{22}$ of the second glass substrate 3 from the thermal expansion coefficient $\alpha_1$ of the sealing material layer 9, is within the range of from 15 to 65($\times 10^{-7}$/° C.), and the difference of the other thermal expansion coefficient from the thermal expansion coefficient $\alpha_1$ of the sealing material layer 9 may be less than 15×10$^{-7}$/° C. Namely, in a case of using the glass substrates comprising different type of glass materials, it is sufficient that the difference of the thermal expansion coefficient of a glass substrate which has larger thermal expansion difference from the sealing material layer 9, from the thermal expansion coefficient $\alpha_1$ of the sealing material layer 9, is within the range of from 15 to 65($\times 10^{-7}$/° C.).

For example, when the difference between the thermal expansion coefficient $\alpha_{21}$ of the first glass substrate 2 and the thermal expansion coefficient $\alpha_1$ of the sealing material layer 9 is within the range of from 15 to 65($\times 10^{-7}$/° C.), and the difference between the thermal expansion coefficient $\alpha_{22}$ of the second glass substrate 3 on which the sealing material layer 9 is formed and the thermal expansion coefficient $\alpha_1$ of the sealing material layer 9 is less than 15×10$^{-7}$/° C., in the melt-bonding step of the sealing material layer 9 by laser light 10, the bonding property between the first glass substrate 2 and the sealing layer 8 and its reliability are improved based on the reduction effect of the residual stress by e.g. lowering of the laser process temperature. The bonding property between the second glass substrate 2 and the sealing layer 8 and its reliability are further improved not only by the lowering effect of residual stress by lowering of laser process temperature, but also by small thermal expansion difference between the second glass substrate 3 and the glass material for sealing. The same effect is obtained also in a case where the thermal expansion coefficient $\alpha_{21}$ of the first glass substrate 2 and the thermal expansion coefficient $\alpha_{22}$ of the second glass substrate 3 are opposite.

In other words, in a case of using a first glass substrate 2 and a second glass substrate 3 comprising different type of glass materials, it is possible to set the thermal expansion coefficient $\alpha_1$ of the sealing material layer 9 so that the difference from the thermal expansion coefficient of one of the glass substrates becomes small. Although the difference between the thermal expansion coefficient of the other glass substrate and the thermal expansion coefficient $\alpha_1$ of the sealing material layer 9 becomes large, it is possible to suppress e.g. cracks or breakage of the glass substrates 2 and 3 or the sealing layer 8 by reducing the filler amount to maintain the fluidity of the glass material for sealing and thereby to lowering the laser process temperature. It is difficult to adjust the thermal expansion coefficient $\alpha_1$ of the sealing material layer 9 to both of the thermal expansion coefficients of the glass substrates 2 and 3 comprising different type of materials. However, in this method, it is sufficient that the thermal expansion coefficient $\alpha_1$ is adjusted only to the thermal expansion coefficient of one of the glass substrates. Accordingly, it is possible to efficiently hermetically seal a space between the glass substrates 2 and 3 comprising different type of materials.

EXAMPLES

Now, the present invention will be described in detail with reference to specific Examples and the evaluation results. However, it should be understood that the present invention is by no means restricted to the following specific Examples, and modification within the scope of the present invention is possible.

Example 1

A bismuth type glass frit (softening point: 410° C.) having a composition of 83 mass % of $Bi_2O_3$, 5 mass % of $B_2O_3$, 11 mass % of ZnO and 1 mass % of $Al_2O_3$ and having an average particle size of 1.0 μm; a cordierite powder as a low-expansion filler; and a laser absorbent having a composition of $Fe_2O_3$—$Cr_2O_3$—MnO—$Co_2O_3$; were prepared. The cordierite powder being the low-expansion filler has a particle size distribution that D10 is 1.3 μm, D50 is 2.0 μm, D90 is 3.0 μm and Dmax is 4.6 μm, and has a specific surface area of 5.8 $m^2/g$. Further, the laser absorbent has a particle size distribution that D10 is 0.4 μm, D50 is 0.9 μm, D90 is 1.5 μm and Dmax is 2.8 μm, and has a specific surface area of 5.0 $m^2/g$. The specific surface areas of the cordierite powder and the laser absorbent were measured by using an BET specific surface area measurement apparatus (Macsorb HM model-1201, manufactured by Mountech Co., Ltd.). The measurement conditions were such that the adsorbent is nitrogen, the carrier gas is helium, the measurement method is floating method (BET one point type), the evacuation temperature was 200° C., the evacuation time was 20 minutes, the evacuation pressure was $N_2$ gas flow/atmospheric pressure, and the sample weight was 1 g. These conditions are common to other Examples.

72.7 vol % of the above bismuth type glass frit, 22.0 vol % of the cordierite powder and the 5.3 vol % of the laser absorbent (the total content of the cordierite powder and the laser absorbent was 27.3 vol %) were mixed to prepare a glass material for sealing, and 80 mass % of the glass material for sealing was mixed with 20 mass % of a vehicle to prepare a sealing material paste. The vehicle is a material prepared by dissolving ethyl cellulose (2.5 mass %) being a binder component in a solvent (97.5 mass %) comprising terpineol. Further, the surface area of the cordierite powder in the glass material for sealing is 3.45 $m^2/cm^3$. The surface area of the laser absorbent in the glass material for sealing is 1.35 $m^2/cm^3$. The thermal expansion coefficient $\alpha_1$ (50 to 250° C.) of the sealing material layer of the sealing material paste was $73 \times 10^{-7}/°$ C.

Here, the thermal expansion coefficient $\alpha_1$ of the sealing material layer is an average linear expansion coefficient within a temperature range of from 50 to 250° C. obtained by firing the above sealing material paste within a temperature range of from 10° C. below the transition point of the sealing glass to 50° C. below the transition point (300° C. in Example 1) for 2 hours to remove the solvent and the binder component, and sintering it within a temperature range of from 30° C. above the softening point of the sealing glass to 30° C. below its crystallization point (480° C. in Example 1) for 10 minutes to obtain a sintered product, grinding the sintered product to prepare a cylindrical rod having a length of 20 mm and a diameter of 5 mm, and measuring the value by TMA8310 manufactured by Rigaku Corporation. This procedure is common to examples of bismuth type glass. In this specification, the transition point is a temperature of the first inflexion point of differential thermal analysis (DTA), the softening point is a temperature of the fourth inflexion point of differential thermal analysis (DTA) and the crystallization point is a temperature at which the heat generation caused by crystallization in thermal differential analysis (DTA) is maximized.

Next, a second glass substrate (dimension: 90×90×0.7 mmt) comprising alkali-free glass (thermal expansion coefficient $\alpha_2$ (50 to 250° C.): $38 \times 10^{-7}/°$ C.) was prepared, a sealing region of the glass substrate was coated with the sealing material paste by a screen printing method, and the paste was dried at 120° C. for 10 minutes. Subsequently, the coating layer was fired at 480° C. for 10 minutes to form a sealing material layer having a thickness T of 7 μm. The difference $(\alpha_1 - \alpha_2)$ between the thermal expansion coefficient $\alpha_1$ ($73 \times 10^{-7}/°$ C.) of the sealing material layer (fired material of the sealing material paste) and the thermal expansion coefficient $\alpha_2$ ($38 \times 10^{-7}/°$ C.) of the glass substrate is $35 \times 10^{-7}/°$ C.

The second glass substrate having the sealing material layer and the first glass substrate (a substrate comprising alkali-free glass having the same composition and the same shape as those of second glass substrate) having an element region (region in which OEL element is formed) were laminated. Subsequently, the sealing material layer was irradiated with laser light (semiconductor laser) having a wavelength of 940 nm, a power of 60 W and a spot diameter of 1.6 mm with a scanning speed of 10 mm/s through the second glass substrate, to melt and quickly solidify the sealing material layer to thereby seal the first glass substrate and the second glass substrate together. The process temperature at the time of laser irradiation (measured by radiation thermometer) was 623° C. Thus, each electronic device wherein an element region was sealed by a glass panel was prepared, and it was subjected to property evaluation to be described later.

Examples 2 to 10

The cordierite powder and the laser absorbent having the particles shapes shown in Tables 1 and 2 were mixed with a bismuth glass frit having the same composition as that of Example 1 at ratios shown in Tables 1 and 2, to prepare a glass material for sealing, and subsequently, they were mixed with vehicles in the same manner as Example 1 to prepare a sealing material paste. By using this sealing material paste, a sealing material layer was formed on a second glass substrate in the same manner as Example 1. The surface areas of the low-expansion filler and the laser absorbent in the glass material for sealing, the thermal expansion coefficient $\alpha_1$ of the sealing material layer, the difference $(\alpha_1-\alpha_2)$ of the thermal expansion coefficient from the glass substrates, the thickness of the sealing material layer are as shown in Tables 1 and 2.

Next, the second glass substrate having the sealing material layer and a first glass substrate having an element region (region in which an OEL element is formed) were laminated. The first and the second glass substrates each comprises alkali-free glass in the same manner as Example 1. Subsequently, the sealing material layer was irradiated with laser light (semiconductor laser) having a wavelength of 940 nm and a spot size of 1.6 mm with a scanning speed of 10 mm/s through the second glass substrate, to melt and quickly solidify the sealing material layer, thereby to seal the first glass substrate and the second glass substrate together. The powers of laser light were set to be the values shown in Tables 1 and 2. The laser process temperatures were as shown in Tables 1 and 2. Thus, each electronic device wherein an element region was sealed by a glass panel was prepared, and it was subjected to property evaluation to be described later.

Examples 11 and 12

A laser absorbent having a particle shape shown in Table 3 was mixed with a bismuth glass frit having the same composition of that of Example 1 with the ratio shown in Table 3, to prepare a glass material for sealing, and subsequently, it was mixed with a vehicle in the same manner as Example 1, to prepare a sealing material paste. Here, no low-expansion filler was used. By using the sealing material paste, a sealing material layer was formed on the second glass substrate in the same manner as Example 1. The surface area of the laser absorbent in the glass material for sealing, the thermal expansion coefficient $\alpha_1$ of the sealing material layer, its difference from the thermal expansion coefficient of the glass substrates $(\alpha_1-\alpha_2)$ and the thickness of the sealing material layer, are as shown in Table 3.

Next, the second glass substrate having the sealing material layer and a first glass substrate having an element region (region in which an OEL element is formed) were laminated. The first and the second glass substrates each comprises alkali-free glass in the same manner as Example 1. Subsequently, the sealing material layer was irradiated with laser light (semiconductor laser) having a wavelength of 940 nm and a spot size of 1.6 mm with a scanning speed of 10 mm/s through the second glass substrate, to melt and quickly solidify the sealing material layer, thereby to seal the first glass substrate and the second glass substrate together. The powers of laser light were set to be the values shown in Table 3. The laser process temperatures were as shown in Table 3. Thus, each electronic device wherein an element region was sealed by a glass panel was prepared, and it was subjected to property evaluation to be described later.

Comparative Examples 1 and 2

A cordierite powder and a laser absorbent having the particle shapes shown in Table 3 were mixed with a bismuth glass frit having the same composition of that of Example 1 with the ratio shown in Table 3, to prepare a glass material for sealing, and subsequently, it was mixed with a vehicle in the same manner as Example 1 to prepare a sealing material paste. By using this sealing material paste, a sealing material layer was formed on a second glass substrate 2 in the same manner as Example 1. The surface areas of the low-expansion filler and the laser absorbent in the glass material for sealing, the thermal expansion coefficient $\alpha_1$ in the sealing material layer, its difference $(\alpha_1-\alpha_2)$ from the thermal expansion coefficient of the glass substrates and the thickness of the sealing material layer, are as shown in Table 3. In Comparative Examples 1 and 2, relatively a large amount of the low-expansion filler (cordierite powder) based on the glass material for sealing was added so that the difference in the thermal expansion coefficient $(\alpha_1-\alpha_2)$ between the sealing material layer and the glass substrates becomes less than $15\times10^{-7}/°$ C.

Next, the second glass substrate having the sealing material layer and a first glass substrate having an element region (region in which an OEL element is formed) were laminated. The first and the second glass substrates each comprises alkali-free glass in the same manner as Example 1. Subsequently, the sealing material layer was irradiated with laser light (semiconductor laser) having a wavelength of 940 nm and a spot size of 1.6 mm with a scanning speed of 10 mm/s through the second glass substrate, to melt and quickly solidify the sealing material layer, thereby to seal the first glass substrate and the second glass substrate together. The powers of laser light were set to be the values shown in Table 3 according to the content of low-expansion filler. The laser process temperatures were as shown in Table 3. Thus, each electronic device was prepared, and it was subjected to property evaluation to be described later.

Example 13

A tin-phosphate glass frit (softening point: 360° C.) having a composition that SnO is 56 mol %, $SnO_2$ is 3 mol %, $P_2O_5$ is 32 mol %, ZnO is 5 mol %, $Al_2O_3$ is 2 mol % and $SiO_2$ is 2 mol % and having an average particle size of 1.5 µm; a zirconium phosphate $((ZrO)_2P_2O_7)$ powder being a low-expansion filler; and a laser absorbent having a composition of $Fe_2O_3$—$Cr_2O_3$—MnO—$Co_2O_3$; were prepared. The zirconium phosphate powder being the low-expansion filler has a particle size distribution that D10 is 0.7 µm, D50 is 1.2 µm, D90 is 2.3 µm and Dmax is 4.6 µm, and has a specific surface area of 4.2 $m^2/g$. The laser absorbent has a particle size distribution that D10 is 0.4 µm, D50 is 0.9 µm, D90 is 1.5 µm and Dmax is 2.8 µm, and has a specific surface area of 5.0 $m^2/g$.

65.9 vol % of the above tin-phosphate glass frit, 29.3 vol % of the zirconium phosphate powder and 4.8 vol % of the laser absorbent (total content of the zirconium phosphate powder and the laser absorbent was 34.1 vol %) were mixed to prepare a glass material for sealing, and 83 mass % of the glass material for sealing was mixed with 17 mass % of a vehicle to prepare a sealing material paste. The vehicle was one prepared by dissolving nitrocellulose (4 mass %) in a solvent (96 mass %) comprising butylcarbitol acetate.

The specific surface area of the zirconium phosphate powder in the glass material for sealing is 4.61 $m^2/cm^3$. The specific surface area of the laser absorbent in the glass material for sealing is 1.22 $m^2/cm^3$. Here, the thermal expansion coefficient $\alpha_1$ (50 to 250° C.) of the sealing material layer of the sealing material paste was $59\times10^{-7}/°$ C.

Here, the thermal expansion coefficient $\alpha_1$ of the sealing material layer is an average linear expansion coefficient within a temperature range of from 50 to 250° C. obtained by firing the above sealing material paste within a temperature range of from 10° C. below the transition point of the sealing glass to 50° C. above the transition point (250° C. in Example 13) for 2 hours to remove the solvent and the binder component, and sintering it within a temperature range of from 30° C. above the softening point of the sealing glass to 30° C. below its crystallization point (430° C. in Example 13) for 10 minutes to obtain a sintered product, grinding the sintered product to prepare a cylindrical rod having a length of 20 mm and a diameter of 5 mm, and measuring the value by TMA8310 manufactured by Rigaku Corporation. This procedure is common to examples of tin-phosphate glass.

Next, a second glass substrate (dimension: 90×90×0.7 mmt) comprising alkali-free glass (thermal expansion coefficient $\alpha_2$ (50 to 250° C.): $38\times10^{-7}/°$ C.) was prepared, a sealing region of the glass substrate was coated with the sealing material paste by a screen printing method, and the paste was dried at 120° C. for 10 minutes. Subsequently, the coating layer was fired at 430° C. for 10 minutes to form a sealing material layer having a thickness T of 7 μm. The difference $(\alpha_1-\alpha_2)$ between the thermal expansion coefficient $\alpha_1$ ($59\times10^{-7}/°$ C.) of the sealing material layer (fired material of the sealing material paste) and the thermal expansion coefficient $\alpha_2$ ($38\times10^{-7}/°$ C.) of the glass substrate is $21\times10^{-7}/°$ C.

The second glass substrate having the sealing material layer and the first glass substrate (a substrate comprising alkali-free glass having the same composition and the same shape as those second glass substrate) having an element region (region in which OEL element is formed) were laminated. Subsequently, the sealing material layer was irradiated with laser light (semiconductor laser) having a wavelength of 940 nm, a power of 85 W and a spot diameter of 1.6 mm with a scanning speed of 10 mm/s through the second glass substrate, to melt and quickly solidify the sealing material layer to seal the first glass substrate and the second glass substrate together. The process temperature at the time of laser irradiation (measured by radiation thermometer) was 890° C. Thus, each electronic device wherein an element region was sealed by a glass panel was prepared, and it was subjected to property evaluation to be described later.

Examples 14 to 17

A zirconium phosphate powder and a laser absorbent having the particle shapes shown in Table 4 were mixed with a tin-phosphate glass frit having the same composition as that of Example 13 at a ratio shown in Table 4, to prepare a glass material for sealing. Subsequently, the glass material for sealing was mixed with a vehicle in the same manner as Example 13 to prepare a sealing material paste, and using the paste, a sealing material layer was formed on a second glass substrate in the same manner as Example 13. The surface areas of the low-expansion filler and the laser absorbent in the glass material for sealing, the thermal expansion coefficient $\alpha_1$ of the sealing material layer, its difference $(\alpha_1-\alpha_2)$ from the thermal expansion coefficient of the glass substrates, and the thickness of the sealing material layer, are as shown in Table 4.

Next, the second glass substrate having the sealing material layer and a first glass substrate having an element region (region in which an OEL element is formed) were laminated. The first and the second glass substrates each comprises alkali-free glass in the same manner as Example 13. Subsequently, the sealing material layer was irradiated with laser light (semiconductor laser) having a wavelength of 940 nm and a spot size of 1.6 mm with a scanning speed of 10 mm/s through the second glass substrate, to melt and quickly solidify the sealing material layer, thereby to seal the first glass substrate and the second glass substrate together. The powers of laser light were set to be the values shown in Table 4. The laser process temperatures were as shown in Table 4. Thus, each electronic device wherein an element region was sealed by a glass panel was prepared, and it was subjected to property evaluation to be described later.

Comparative Example 3

A cordierite powder and a laser absorbent having the particle shapes shown in Table 5 were mixed with a bismuth glass frit having the same composition of that of Example 13 with the ratio shown in Table 5, to prepare a glass material for sealing, and subsequently, it was mixed with a vehicle in the same manner as Example 13 to prepare a sealing material paste. By using this sealing material paste, a sealing material layer was formed on a second glass substrate 2 in the same manner as Example 13. The surface areas of the low-expansion filler and the laser absorbent in the glass material for sealing, the thermal expansion coefficient $\alpha_1$ in the sealing material layer, its difference $(\alpha_1-\alpha_2)$ from the thermal expansion coefficient of the glass substrates and the thickness of the sealing material layer, are as shown in Table 5. In Comparative Example 3, relatively a large amount of the low-expansion filler (cordierite powder) based on the glass material for sealing was added so that the difference in the thermal expansion coefficient $(\alpha_1-\alpha_2)$ between the sealing material layer and the glass substrates becomes less than $15\times10^{-7}/°$ C.

Next, the second glass substrate having the sealing material layer and a first glass substrate having an element region (region in which an OEL element is formed) were laminated. The first and the second glass substrates each comprises alkali-free glass in the same manner as Example 13. Subsequently, the sealing material layer was irradiated with laser light (semiconductor laser) having a wavelength of 940 nm and a spot size of 1.6 mm with a scanning speed of 10 mm/s through the second glass substrate, to melt and quickly solidify the sealing material layer, thereby to seal the first glass substrate and the second glass substrate together. The powers of laser light were set to be the values shown in Table 5 according to the content of low-expansion filler. The laser process temperatures were as shown in Table 5. Thus, each electronic device was prepared, and it was subjected to property evaluation to be described later.

Comparative Example 4

A laser absorbent having the particle shape shown in Table 5 was mixed with a tin-phosphate glass frit having the same composition as that of Example 13 at a ratio shown in Table 5, to prepare a glass material for sealing. In this Comparative Example, no low-expansion filler was employed. Subsequently, the glass material for sealing was mixed with a vehicle in the same manner as Example 13 to prepare a sealing material paste, and using the paste, a sealing material layer was formed on the second glass substrate in the same manner as Example 13. The thermal expansion coefficient $\alpha_1$ of the sealing material layer is $113\times10^{-7}/°$ C., and its difference from the thermal expansion coefficient $\alpha_2$ ($38\times10^{-7}/°$ C.) of the glass substrates is $75\times10^{-7}/°$ C. The specific surface area of the laser absorbent in the glass material for sealing and the thickness of the sealing material layer are as shown in Table 5.

Next, the second glass substrates having the sealing material layer and a first glass substrate having an element region (region in which an OEL element is formed) were laminated. The first and the second glass substrates each comprises alkali-free glass in the same manner as Example 13. Subsequently, the sealing material layer was irradiated with laser light (semiconductor laser) having a wavelength of 940 nm and a spot size of 1.6 mm with a scanning speed of 10 mm/s through the second glass substrate, to melt and quickly solidify the sealing material layer, thereby to seal the first glass substrate and the second glass substrate together. The powers of laser light were set to be the values shown in Table 5. The laser process temperatures were as shown in Table 5. Thus, each electronic device wherein an element region was sealed by a glass panel was prepared, and it was subjected to property evaluation to be described later.

Comparative Example 5

A zirconium phosphate powder and a laser absorbent having the particle shapes shown in Table 5 were mixed with a tin-phosphate glass frit having the same composition as that of Example 13 at the ratio shown in Table 5, to prepare a glass material for sealing. The zirconium phosphate powder and the laser absorbent were ones prepared for 38 μm film thickness. Subsequently, the glass material for sealing was mixed with a vehicle in the same manner as Example 13 to prepare a sealing material paste, and using the paste, a sealing material layer having a thickness of 38 μm was formed on the second glass substrate in the same manner as Example 13.

Next, the second glass substrates having the sealing material layer and a first glass substrate having an element region (region in which an OEL element is formed) were laminated. The first and the second glass substrates each comprises alkali-free glass in the same manner as Example 13. Subsequently, the sealing material layer was irradiated with laser light (semiconductor laser) having a wavelength of 940 nm and a spot size of 1.6 mm with a scanning speed of 10 mm/s through the second glass substrate, to melt and quickly solidify the sealing material layer, thereby to seal the first glass substrate and the second glass substrate together. The powers of laser light were set to be the values shown in Table 5. The laser process temperatures were as shown in Table 5. Thus, each electronic device was prepared, and it was subjected to property evaluation to be described later.

Next, with respect to the external appearance of each glass panel of Examples 1 to 17 and Comparative Examples 1 to 5, pealing of the sealing layer and cracks in the glass substrates and the sealing layer at the end of irradiation of laser light, were evaluated. The external appearance was evaluated by optical microscopic observation. Airtightness of each glass panel was evaluated by applying a helium-leakage test. Further, the thickness of the sealing layer in each Example was measured by the procedure described below. Further, the distortion of each glass substrate sealed under the condition of each Example was measured by a procedure described below. These measurement and evaluation results are shown in Tables 1 to 5 together with preparation conditions of glass panels.

The thickness of the sealing layer was measured as follows. A glass panel of each Example sealed with a sealing layer was cut by a dicing machine, and the section was observed by a scanning electromicroscope to measure the thickness of the sealing layer.

Distortion of a glass substrate was measured as follows. First, on an alkali-free glass substrate (10×60×0.7 mmt) having a mirror-polished cross-section, the sealing material paste prepared in each Example was applied by a screen printing method, and dried in a batch-type drying furnace under the condition of 120° C.×10 minutes. Subsequently, each paste was fired in a firing furnace under optimum firing conditions to form a sealing material layer having a line width of 1 mm, a length of 30 mm and a thickness of 7 μm (a thickness of 38 μm in Comparative Example 5). A glass substrate provided with a sealing material layer thus obtained was laminated with another alkali-free glass substrate, and the sealing material layer was irradiated with a laser light having a wavelength of 940 nm and a spot size of 1.6 mm with a scanning speed of 10 mm/s under a load of 500 g, to carry out bonding. The power of the laser light was adjusted according to each Example.

Thus, a sample having a ratio (S2/S1) of the bonding area S2 of the sealing material layer (area of bonding between the melt-solidified layer of the sealing material layer and the glass substrate) based on the area S1 of the sealing material layer before bonding, of from 90 to 95%. The distortion amount of glass substrates of each sample was measured. In the measurement of distortion amount, cross-section of each sample was observed by using a birefringent imaging system to measure the distortion (retardation: nm) in the glass substrate.

TABLE 1

| | | | | Ex. 1 | Ex. 2 | Ex. 3 | Ex. 4 | Ex. 5 |
|---|---|---|---|---|---|---|---|---|
| Glass material for sealing | Sealing glass | Material | | Bismuth glass | | | | |
| | | Content (volume %) | | 72.7 | 56.6 | 64.6 | 72.7 | 68.0 |
| | Laser absorbent | Material | | Fe—Cr—Mn—Co—O | | | | |
| | | Particle shape | D10 (μm) | 0.4 | 0.4 | 0.4 | 0.4 | 0.4 |
| | | | D50 (μm) | 0.9 | 0.9 | 0.9 | 0.9 | 0.9 |
| | | | D90 (μm) | 1.5 | 1.5 | 1.5 | 1.5 | 1.5 |
| | | | Dmax (μm) | 2.8 | 2.8 | 2.8 | 2.8 | 2.8 |
| | | | Specific surface area (m$^2$/g) | 5.0 | 5.0 | 5.0 | 5.0 | 5.0 |
| | | | Specific gravity (g/cm$^3$) | 5.1 | 5.1 | 5.1 | 5.1 | 5.1 |
| | | | Surface area of laser absorbent in glass material for sealing (m$^2$/cm$^3$) | 1.35 | 1.17 | 1.25 | 1.35 | 2.55 |
| | | Content (volume %) | | 5.3 | 4.6 | 4.9 | 5.3 | 10.0 |
| | Low-expansion filler | Material | | Cordierite | | | | |
| | | Particle shape | D10 (μm) | 1.3 | 2.1 | 2.1 | 2.1 | 2.1 |
| | | | D50 (μm) | 2.0 | 2.9 | 2.9 | 2.9 | 2.9 |
| | | | D90 (μm) | 3.0 | 4.1 | 4.1 | 4.1 | 4.1 |
| | | | Dmax (μm) | 4.6 | 6.5 | 6.5 | 6.5 | 6.5 |
| | | | Specific surface area (m$^2$/g) | 5.8 | 2.8 | 2.8 | 2.8 | 2.8 |
| | | | Specific gravity (g/cm$^3$) | 2.7 | 2.7 | 2.7 | 2.7 | 2.7 |

TABLE 1-continued

|  |  | Ex. 1 | Ex. 2 | Ex. 3 | Ex. 4 | Ex. 5 |
|---|---|---|---|---|---|---|
|  | Surface area of low-expansion filler in glass material for sealing (m²/cm³) | 3.45 | 2.96 | 2.36 | 1.68 | 1.68 |
|  | Content (volume %) | 22.0 | 38.8 | 31.0 | 22.0 | 22.0 |
|  | Total content of filler (volume %) | 27.3 | 43.4 | 35.9 | 27.3 | 32.0 |
|  | Surface area of filler in glass material for sealing (m²/cm³) | 4.81 | 4.13 | 3.61 | 3.03 | 4.23 |
| Thermal expansion coefficient of sealing material layer $\alpha_1$ (×10⁻⁷/° C.) | | 73 | 57 | 64 | 73 | 73 |
| Glass substrate | | \multicolumn{5}{c}{Alkali-free glass (90 × 90 × 0.7 mm/$\alpha_2$ = 38 × 10⁻⁷/° C.)} |
| Thickness of sealing material layer (μm) | | 7 | 7 | 7 | 7 | 7 |
| α-Difference between glass substrate and sealing material layer | | 35 | 19 | 26 | 35 | 35 |
| Sealing step | Laser power (W) | 60 | 78 | 69 | 60 | 50 |
|  | Laser scanning speed (mm/s) | 10 | 10 | 10 | 10 | 10 |
|  | Process temperature (° C.) | 623 | 865 | 730 | 606 | 606 |
|  | Thickness of sealing layer (μm) | — | — | 6 | — | — |
| Evaluation result | External appearance Pealing | None | None | None | None | None |
|  | Cracks | None | None | None | None | None |
|  | Airtightness | Exist | Exist | Exist | Exist | Exist |
|  | Distortion amount of glass substrate (nm) | — | — | 35 | 22 | 19 |

TABLE 2

|  |  |  |  | Ex. 6 | Ex. 7 | Ex. 8 | Ex. 9 | Ex. 10 |
|---|---|---|---|---|---|---|---|---|
| Glass material for sealing | Sealing glass | Material | | \multicolumn{5}{c}{Bismuth glass} |
|  |  | Content (volume %) | | 81.6 | 56.6 | 64.1 | 72.7 | 81.6 |
|  | Laser absorbent | Material | | \multicolumn{5}{c}{Fe—Cr—Mn—Co—O} |
|  |  | Particle shape | D10 (μm) | 0.4 | 0.4 | 0.4 | 0.4 | 0.4 |
|  |  |  | D50 (μm) | 0.9 | 0.9 | 0.9 | 0.9 | 0.9 |
|  |  |  | D90 (μm) | 1.5 | 1.5 | 1.5 | 1.5 | 1.5 |
|  |  |  | Dmax (μm) | 2.8 | 2.8 | 2.8 | 2.8 | 2.8 |
|  |  |  | Specific surface area (m²/g) | 5.0 | 5.0 | 5.0 | 5.0 | 5.0 |
|  |  |  | Specific gravity (g/cm³) | 5.1 | 5.1 | 5.1 | 5.1 | 5.1 |
|  |  |  | Surface area of laser absorbent in glass material for sealing (m²/cm³) | 1.50 | 1.17 | 1.25 | 1.35 | 1.50 |
|  |  | Content (volume %) | | 5.9 | 4.6 | 4.9 | 5.3 | 5.9 |
|  | Low-expansion filler | Material | | \multicolumn{5}{c}{Cordierite} |
|  |  | Particle shape | D10 (μm) | 2.1 | 2.1 | 2.1 | 2.1 | 2.1 |
|  |  |  | D50 (μm) | 2.9 | 2.9 | 2.9 | 2.9 | 2.9 |
|  |  |  | D90 (μm) | 4.1 | 4.1 | 4.1 | 4.1 | 4.1 |
|  |  |  | Dmax (μm) | 6.5 | 6.5 | 6.5 | 6.5 | 6.5 |
|  |  |  | Specific surface area (m²/g) | 2.8 | 2.8 | 2.8 | 2.8 | 2.8 |
|  |  |  | Specific gravity (g/cm³) | 2.7 | 2.7 | 2.7 | 2.7 | 2.7 |
|  |  |  | Surface area of low-expansion filler in glass material for sealing (m²/cm³) | 0.95 | 2.96 | 2.36 | 1.68 | 0.95 |
|  |  | Content (volume %) | | 12.5 | 38.8 | 31.0 | 22.0 | 12.5 |
|  | Total content of filler (volume %) | | | 18.4 | 43.4 | 35.9 | 27.3 | 18.4 |
|  | Surface area of filler in glass material for sealing (m²/cm³) | | | 2.46 | 4.13 | 3.61 | 3.03 | 2.46 |
| Thermal expansion coefficient of sealing material layer $\alpha_1$ (×10⁻⁷/° C.) | | | | 85 | 57 | 64 | 73 | 85 |
| Glass substrate | | | | \multicolumn{5}{c}{Alkali-free glass (90 × 90 × 0.7 mm/$\alpha_2$ = 38 × 10⁻⁷/° C.)} |
| Thickness of sealing material layer (μm) | | | | 7 | 15 | 15 | 12 | 14 |
| α-Difference between glass substrate and sealing material layer | | | | 47 | 19 | 26 | 35 | 47 |
| Sealing step | Laser power (W) | | | 55 | 45 | 41 | 40 | 50 |
|  | Laser scanning speed (mm/s) | | | 10 | 10 | 10 | 10 | 10 |
|  | Process temperature (° C.) | | | 540 | 760 | 606 | 537 | 540 |
|  | Thickness of sealing layer (μm) | | | — | — | — | — | — |
| Evaluation result | External appearance | Pealing | | None | None | None | None | None |
|  |  | Cracks | | None | None | None | None | None |
|  | Airtightness | | | Exist | Exist | Exist | Exist | Exist |
|  | Distortion amount of glass substrate (nm) | | | 21 | — | — | — | — |

TABLE 3

|  |  |  |  | Ex. 11 | Ex. 12 | Comp. Ex. 1 | Comp. Ex. 2 |
|---|---|---|---|---|---|---|---|
| Glass material for sealing | Sealing glass | Material | | \multicolumn{4}{c}{Bismuth glass} |
|  |  | Content (volume %) | | 93.3 | 93.3 | 49.8 | 49.8 |
|  | Laser absorbent | Material | | \multicolumn{4}{c}{Fe—Cr—Mn—Co—O} |
|  |  | Particle shape | D10 (μm) | 0.4 | 0.4 | 0.4 | 0.4 |
|  |  |  | D50 (μm) | 0.9 | 0.9 | 0.9 | 0.9 |

TABLE 3-continued

|  |  |  | Ex. 11 | Ex. 12 | Comp. Ex. 1 | Comp. Ex. 2 |
|---|---|---|---|---|---|---|
|  |  | D90 (μm) | 1.5 | 1.5 | 1.5 | 1.5 |
|  |  | Dmax (μm) | 2.8 | 2.8 | 2.8 | 2.8 |
|  |  | Specific surface area (m²/g) | 5.0 | 5.0 | 5.0 | 5.0 |
|  |  | Specific gravity (g/cm³) | 5.1 | 5.1 | 5.1 | 5.1 |
|  |  | Surface area of laser absorbent in glass material for sealing (m²/cm³) | 1.71 | 1.71 | 1.12 | 1.12 |
|  | Content (volume %) |  | 6.7 | 6.7 | 4.4 | 4.4 |
| Low-expansion filler | Material |  | — | — | Cordierite | |
|  | Particle shape | D10 (μm) | — | — | 2.1 | 2.1 |
|  |  | D50 (μm) | — | — | 2.9 | 2.9 |
|  |  | D90 (μm) | — | — | 4.1 | 4.1 |
|  |  | Dmax (μm) | — | — | 6.5 | 6.5 |
|  |  | Specific surface area (m²/g) | — | — | 2.8 | 2.8 |
|  |  | Specific gravity (g/cm³) | — | — | 2.7 | 2.7 |
|  |  | Surface area of low-expansion filler in glass material for sealing (m²/cm³) | — | — | 3.49 | 3.49 |
|  | Content (volume %) |  | 0 | 0 | 45.8 | 45.8 |
| Total content of filler (volume %) |  |  | 6.7 | 6.7 | 50.2 | 50.2 |
| Surface area of filler in glass material for sealing (m²/cm³) |  |  | 1.71 | 1.71 | 4.62 | 4.62 |
| Thermal expansion coefficient of sealing material layer $\alpha_1$ (×10⁻⁷/° C.) |  |  | 101 | 101 | 52 | 52 |
| Glass substrate |  |  | Alkali-free glass (90 × 90 × 0.7 mm/ $\alpha_2 = 38 \times 10^{-7}$/° C.) | | | |
| Thickness of sealing material layer (μm) |  |  | 8 | 15 | 7 | 15 |
| α-Difference between glass substrate and sealing material layer |  |  | 63 | 63 | 14 | 14 |
| Sealing step | Laser power (W) |  | 55 | 50 | 81 | 62 |
|  | Laser scanning speed (mm/s) |  | 10 | 10 | 10 | 10 |
|  | Process temperature (° C.) |  | 540 | 540 | 1065 | 960 |
|  | Thickness of sealing layer (μm) |  | — | — | — | — |
| Evaluation result | External appearance | Pealing | None | None | None | None |
|  |  | Cracks | None | None | Exist | Exist |
|  | Airtightness |  | Exist | Exist | None | None |
|  | Distortion amount of glass substrate (nm) |  | 21 | — | — | — |

TABLE 4

|  |  |  | Ex. 13 | Ex. 14 | Ex. 15 | Ex. 16 | Ex. 17 |
|---|---|---|---|---|---|---|---|
| Glass material for sealing | Sealing glass | Material | Tin-phosphate glass | | | | |
|  |  | Content (volume %) | 65.9 | 58.5 | 61.6 | 64.9 | 67.2 |
|  | Laser absorbent | Material | Fe—Cr—Mn—Co—O | | | | |
|  |  | Particle shape D10 (μm) | 0.4 | 0.4 | 0.4 | 0.4 | 0.4 |
|  |  | D50 (μm) | 0.9 | 0.9 | 0.9 | 0.9 | 0.9 |
|  |  | D90 (μm) | 1.5 | 1.5 | 1.5 | 1.5 | 1.5 |
|  |  | Dmax (μm) | 2.8 | 2.8 | 2.8 | 2.8 | 2.8 |
|  |  | Specific surface area (m²/g) | 5.0 | 5.0 | 5.0 | 5.0 | 5.0 |
|  |  | Specific gravity (g/cm³) | 5.1 | 5.1 | 5.1 | 5.1 | 5.1 |
|  |  | Surface area of laser absorbent in glass material for sealing (m²/cm³) | 1.22 | 0.71 | 0.74 | 0.74 | 1.12 |
|  | Content (volume %) |  | 4.8 | 2.8 | 2.9 | 2.9 | 4.4 |
| Low-expansion filler | Material |  | Zirconium phosphate | | | | |
|  | Particle shape | D10 (μm) | 0.7 | 3.3 | 3.3 | 3.3 | 3.3 |
|  |  | D50 (μm) | 1.2 | 3.8 | 3.8 | 3.8 | 3.8 |
|  |  | D90 (μm) | 2.3 | 4.6 | 4.6 | 4.6 | 4.6 |
|  |  | Dmax (μm) | 4.6 | 6.5 | 6.5 | 6.5 | 6.5 |
|  |  | Specific surface area (m²/g) | 4.2 | 1.8 | 1.8 | 1.8 | 1.8 |
|  |  | Specific gravity (g/cm³) | 3.7 | 3.1 | 3.1 | 3.1 | 3.1 |
|  |  | Surface area of low-expansion filler in glass material for sealing (m²/cm³) | 4.61 | 2.14 | 1.96 | 1.78 | 1.57 |
|  | Content (volume %) |  | 29.3 | 38.7 | 35.5 | 32.3 | 28.4 |
| Total content of filler (volume %) |  |  | 34.1 | 41.5 | 38.4 | 35.1 | 32.8 |
| Surface area of filler in glass material for sealing (m²/cm³) |  |  | 5.83 | 2.82 | 2.70 | 2.52 | 2.69 |
| Thermal expansion coefficient of sealing material layer $\alpha_1$ (×10⁻⁷/° C.) |  |  | 59 | 55 | 60 | 67 | 71 |
| Glass substrate |  |  | Alkali-free glass (90 × 90 × 0.7 mm/$\alpha_2 = 38 \times 10^{-7}$/° C.) | | | | |
| Thickness of sealing material layer (μm) |  |  | 7 | 7 | 7 | 7 | 7 |
| α-Difference between glass substrate and sealing material layer |  |  | 21 | 17 | 22 | 29 | 33 |
| Sealing step | Laser power (W) |  | 85 | 128 | 125 | 120 | 85 |
|  | Laser scanning speed (mm/s) |  | 10 | 10 | 10 | 10 | 10 |
|  | Process temperature (° C.) |  | 890 | 930 | 880 | 800 | 740 |
|  | Thickness of sealing layer (μm) |  | — | — | — | — | — |

TABLE 4-continued

|  |  |  | Ex. 13 | Ex. 14 | Ex. 15 | Ex. 16 | Ex. 17 |
|---|---|---|---|---|---|---|---|
| Evaluation result | External appearance | Pealing Cracks | None None | None None | None None | None None | None None |

TABLE 5

|  |  |  |  | Comp. Ex. 3 | Comp. Ex. 4 | Comp. Ex. 5 |
|---|---|---|---|---|---|---|
| Glass material for sealing | Sealing glass | Material | | Tin-phosphate glass | | |
| | | Content (volume %) | | 55.3 | 95.1 | 47.4 |
| | Laser absorbent | Material | | Fe—Cr—Mn—Co—O | | |
| | | Particle shape | D10 (μm) | 0.4 | 0.4 | 1.4 |
| | | | D50 (μm) | 0.9 | 0.9 | 2.7 |
| | | | D90 (μm) | 1.5 | 1.5 | 6.1 |
| | | | Dmax (μm) | 2.8 | 2.8 | 26.2 |
| | | | Specific surface area (m$^2$/g) | 5.0 | 5.0 | 1.2 |
| | | | Specific gravity (g/cm$^3$) | 5.1 | 5.1 | 5.1 |
| | | | Surface area of laser absorbent in glass material for sealing (m$^2$/cm$^3$) | 1.71 | 1.25 | 0.10 |
| | | Content (volume %) | | 2.8 | 4.9 | 1.7 |
| | Low-expansion filler | Material | | Zirconium phosphate | | |
| | | Particle shape | D10 (μm) | 3.3 | — | 7.3 |
| | | | D50 (μm) | 3.8 | — | 8.8 |
| | | | D90 (μm) | 4.6 | — | 10.7 |
| | | | Dmax (μm) | 6.5 | — | 15.6 |
| | | | Specific surface area (m$^2$/g) | 1.8 | — | 0.9 |
| | | | Specific gravity (g/cm$^3$) | 3.1 | — | 3.7 |
| | | | Surface area of low-expansion filler in glass material for sealing (m$^2$/cm$^3$) | 2.31 | — | 1.65 |
| | | Content (volume %) | | 41.9 | 0 | 50.9 |
| | Total content of filler (volume %) | | | 44.7 | 4.9 | 52.6 |
| | Surface area of filler in glass material for sealing (m$^2$/cm$^3$) | | | 3.03 | 1.25 | 1.75 |
| Thermal expansion coefficient of sealing material layer $\alpha_1$ ($\times 10^{-7}$/° C.) | | | | 50 | 113 | 52 |
| Glass substrate | | | | Alkali-free glass (90 × 90 × 0.7 mm/ $\alpha_2 = 38 \times 10^{-7}$/° C.) | | |
| Thickness of sealing material layer (μm) | | | | 7 | 9 | 38 |
| α-Difference between glass substrate and sealing material layer | | | | 12 | 75 | 14 |
| Sealing step | Laser power (W) | | | 135 | 85 | 52 |
| | Laser scanning speed (mm/s) | | | 10 | 10 | 10 |
| | Process temperature (° C.) | | | At least 1,000 | 900 | 960 |
| | Thickness of sealing layer (μm) | | | — | — | 35 |
| Evaluation result | External appearance | Pealing | | Exist | Exist | None |
| | | Cracks | | Exist | Exist | None |
| | Airtightness | | | None | None | Exist |
| | Distortion amount of glass substrate (nm) | | | — | — | 66 |

As evident from Tables 1 to 5, each of the glass panels of Examples 1 to 17 is excellent in external appearance and airtightness, and distortion amount of its glass substrate is small. With respect to distortion amount of glass substrate, the distortion amounts of Examples 3 to 6 wherein each sealing material layer has a small thickness of at most 15 μm, are lower than the distortion amount of the glass panel of Example 5 wherein the sealing material layer has a large thickness of 38 μm and the laser process temperature was lowered. Accordingly, it was confirmed that they were sealed with good conditions. On the other hand, in Examples 1 to 3 wherein the content of low-expansion filler was increased and the laser process temperature was increased according to the increase of the content, residual stress formed in the glass substrates by the laser sealing step was large, and it was confirmed that cracks are formed in the glass substrates or the sealing layer. Further, also in Comparative Example 4 wherein the amount of filler was extremely small, it was confirmed that cracks were formed in the glass substrate or the sealing layer.

Example 18

Using a sealing material paste containing the same glass material for sealing as that of Example 4, a sealing material layer (thermal expansion coefficient $\alpha_1$ of the sealing material layer: $73 \times 10^{-7}$/° C.) was formed on a second glass substrate (thermal expansion coefficient $\alpha_{22}$: $38 \times 10^{-7}$/° C.) comprising alkali-free glass in the same manner as Example 4. The thermal expansion difference between the sealing material layer and the second glass substrate is $35 \times 10^{-7}$/° C. Next, a first glass substrate (thermal expansion coefficient $\alpha_{21}$: $83 \times 10^{-7}$/° C.) comprising soda lime glass was prepared, and it was laminated with the second glass substrate. The thermal expansion difference between the first glass substrate and the sealing material layer is $10 \times 10^{-7}$/° C. Subsequently, irradiation of laser light was carried out in the same manner as Example 4 to seal the first glass substrate and the second glass substrate together. External appearance and airtightness of a glass panel thus obtained were evaluated according to the above-described method. Table 6 shows the results.

Example 19

Using a sealing material paste containing the same glass material for sealing as that of Example 4, a sealing material layer (thermal expansion coefficient $\alpha_1$ of the sealing material layer: $73 \times 10^{-7}/°$ C.) was formed in the same manner as Example 4 except that a second glass substrate (thermal expansion coefficient $\alpha_{22}$: $38 \times 10^{-7}/°$ C.) comprising soda lime glass was employed. The thermal expansion difference between the sealing material layer and the second glass substrate is $10 \times 10^{-7}/°$ C. Subsequently, a first glass substrate (thermal expansion coefficient $\alpha_{21}$: $38 \times 10^{-7}/°$ C.) comprising alkali-free glass was prepared, and it was laminated with the above second glass substrate. The thermal expansion difference between the first glass substrate and the sealing material layer is $35 \times 10^{-7}/°$ C. Thereafter, irradiation of laser light was carried out under the same conditions as those of Example 4 to seal the first glass substrate and the second glass substrate together. External appearance and airtightness of a glass panel thus obtained were evaluated according to the method described above. Table 6 shows the results.

Example 20

Using a sealing material paste containing the same glass material for sealing as that of Example 4, a sealing material layer (thermal expansion coefficient $\alpha_1$ of the sealing material layer: $73 \times 10^{-7}/°$ C.) was formed on a second glass substrate (thermal expansion coefficient $\alpha_{22}$: $38 \times 10^{-7}/°$ C.) comprising alkali-free glass in the same manner as Example 4. The thermal expansion difference between the sealing material layer and the second glass substrate is $35 \times 10^{-7}/°$ C. Next, as a first glass substrate, a soda lime glass substrate PD200 (product name, manufactured by Asahi Glass Company, Limited (thermal expansion coefficient $\alpha_{21}$: $83 \times 10^{-7}/°$ C.)) was prepared, and it was laminated with the above second glass substrate. The thermal expansion difference between the first glass substrate and the sealing material layer is $10 \times 10^{-7}/°$ C. Thereafter, irradiation of laser light was carried out under the same conditions as those of Example 4 to seal the first glass substrate and the second glass substrate together. External appearance and airtightness of a glass panel thus obtained were evaluated according to the method described above. Table 6 shows the results.

Example 21

Using a sealing material paste containing the same glass material for sealing as that of Example 4, a sealing material layer (thermal expansion coefficient $\alpha_1$ of the sealing material layer: $73 \times 10^{-7}/°$ C.) was formed in the same manner as Example 4 except that a soda lime substrate PD200 (product name, manufactured by Asahi Glass Company, Limited (thermal expansion coefficient $\alpha_{22}$: $83 \times 10^{-7}/°$ C.)) was employed as a second glass substrate. The thermal expansion difference between the sealing material layer and the second glass substrate is $10 \times 10^{-7}/°$ C. Next, a first glass substrate (thermal expansion coefficient $\alpha_{21}$: $38 \times 10^{-7}/°$ C.) comprising alkali-free glass was prepared, and it was laminated with the above second glass substrate. The thermal expansion difference between the first glass substrate and the sealing material layer is $35 \times 10^{-7}/°$ C. Thereafter, irradiation of laser light was carried out under the same conditions as those of Example 4, to seal the first glass substrate and the second glass substrate together. External appearance and airtightness of a glass panel thus obtained were evaluated according to the method described above. Table 6 shows the results.

TABLE 6

| | | Ex. 18 | Ex. 19 | Ex. 20 | Ex. 21 |
|---|---|---|---|---|---|
| Glass material for sealing | Material | \multicolumn{4}{c}{Same material as Ex. 4} | | | |
| Thermal expansion coefficient $\alpha_1$ ($\times 10^{-7}/°$ C.) of sealing material layer | | 73 | | | |
| Second glass substrate | Material | Alkali-free glass (90 × 90 × 0.7 mm) | Soda lime glass (90 × 90 × 2.8 mm) | Alkali-free glass (90 × 90 × 0.7 mm) | Soda lime glass PD 200 (90 × 90 × 2.8 mm) |
| | Thermal expansion coefficient $\alpha_{22}$ ($\times 10^{-7}/°$ C.) | 38 | 83 | 38 | 83 |
| $\alpha$-Difference between sealing material layer and first glass substrate | | 35 | 10 | 35 | 10 |
| First glass substrate | Material | Soda lime glass (90 × 90 × 2.8 mm) | Alkali-free glass (90 × 90 × 0.7 mm) | Soda lime glass PD 200 (90 × 90 × 2.8 mm) | Alkali-free glass (90 × 90 × 0.7 mm) |
| | Thermal expansion coefficient $\alpha_{21}$ ($\times 10^{-7}/°$ C.) | 83 | 38 | 83 | 38 |
| $\alpha$-Difference between sealing material layer and second glass substrate | | 10 | 35 | 10 | 35 |
| Evaluation result | External appearance — Pealing | None | None | None | None |
| | Cracks | None | None | None | None |
| | Airtightness | Exist | Exist | Exist | Exist |

INDUSTRIAL APPLICABILITY

The glass member provided with a sealing material layer of the present invention is useful as a glass substrate to be employed for producing a flat panel display device or a solar cell panel having a construction wherein a display element or a solar cell element is sealed between two glass substrates disposed so as to be opposed to each other. Further, the electronic device of the present invention is a flat type display device or a solar cell panel having the above structure.

This application is a continuation of PCT Application No. PCT/JP2010/061075, filed Jun. 29, 2010, which is based upon and claims the benefit of priority from Japanese Patent Application No. 2009-154954 filed on Jun. 30, 2009 and Japanese Patent Application No. 2010-015143 filed on Jan. 27, 2010. The contents of those applications are incorporated herein by reference in its entirety.

REFERENCE SYMBOLS

1: Electronic device, 2: First glass substrate, 2a: Surface, 3: Second glass substrate, 3a: Surface, 4: Electronic element portion, 5: Element region, 6: First sealing region, 7: Second sealing region, 8: Sealing layer, 9: Sealing material layer, 10: Laser light.

What is claimed is:

1. A glass member provided with a sealing material layer, which comprises a glass substrate having a surface having a sealing region; and a sealing material layer having a thickness of at most 15 μm and formed on the sealing region of the glass substrate;
    wherein the sealing material layer comprises a fired material of a glass material for sealing containing a sealing glass, a laser absorbent and optionally a low-expansion filler, the total content of the laser absorbent and the low-expansion filler being an optional component being within the range of from 2 to 44 vol %; and
    wherein the difference between the thermal expansion coefficient $\alpha_1$ of the material of the sealing material layer and the thermal expansion coefficient $\alpha_2$ of the glass substrate is within the range of from 15 to 65($\times 10^{-7}$/° C.).

2. The glass member provided with a sealing material layer according to claim 1, wherein the glass material for sealing contains the laser absorbent in an amount within the range of from 2 to 10 vol % and the low-expansion filler in an amount within the range of from 0 to 40 vol % based on the total amount of the sealing glass, the laser absorbent and the low-expansion filler.

3. The glass member provided with a sealing material layer according to claim 2, wherein the glass material for sealing contains the low-expansion filler in an amount within the range of from 10 to 40 vol %.

4. The glass member provided with a sealing material layer according to claim 1, wherein the total surface area of the laser absorbent and the low-expansion filler in the glass material for sealing is within the range of from 0.5 to 6 m²/cm³.

5. The glass member provided with a sealing material layer according to claim 1, wherein the low-expansion filler comprises at least one member selected from silica, alumina, zirconia, zirconium silicate, cordierite, a zirconium phosphate compound, soda lime glass and borosilicate glass.

6. The glass member provided with a sealing material layer according to claim 1, wherein the laser absorbent comprises at least one metal selected from Fe, Cr, Mn, Co, Ni and Cu or a compound containing the metal.

7. The glass member provided with a sealing material layer according to claim 1, wherein the glass substrate comprises alkali-free glass or soda lime glass, and the sealing glass comprises bismuth glass or tin-phosphate glass.

8. An electronic device which comprises a first glass substrate having a surface having a first sealing region;
    a second glass substrate having a surface having a second sealing region corresponding to the first sealing region and disposed so that the surface is opposed to the surface of the first glass substrate;
    an electronic element portion provided between the first glass substrate and the second glass substrate; and
    a sealing layer formed between the first sealing region of the first glass substrate and the second sealing region of the second glass substrate to seal the electronic element portion and having a thickness of at most 15 μm;
    wherein the sealing layer comprises a melt-bonded layer comprising a fired material of a glass material for sealing containing a sealing glass, a laser absorbent and optionally a low-expansion filler, the total content of the laser absorbent and the low-expansion filler being an optional component being within the range of from 2 to 44 vol %; and
    wherein the difference between the thermal expansion coefficient $\alpha_1$ of the material of the sealing layer and the thermal expansion coefficient $\alpha_2$ of at least one of the first glass substrate and the second glass substrate is within the range of from 15 to 65($\times 10^{-7}$/° C.).

9. The electronic device according to claim 8, wherein the difference of each of the thermal expansion coefficient $\alpha_{21}$ of the first glass substrate and the thermal expansion coefficient $\alpha_{22}$ of the second glass substrate from the thermal expansion coefficient $\alpha_1$ of the material of the sealing layer is within the range of from 15 to 65($\times 10^{-7}$/° C.).

10. The electronic device according to claim 8, wherein the difference of either one of the thermal expansion coefficient $\alpha_{21}$ of the first glass substrate and the thermal expansion coefficient $\alpha_{22}$ of the second glass substrate from the thermal expansion coefficient $\alpha_1$ of the material of the sealing layer is within the range of from 15 to 65($\times 10^{-7}$/° C.), and the difference of the other one of the thermal expansion coefficients from the thermal expansion coefficient $\alpha_1$ of the material of the sealing layer is less than $15 \times 10^{-7}$/° C.

11. The electronic device according to claim 8, wherein the total surface area of the laser absorbent and the low-expansion filler in the glass material for sealing is within the range of from 0.5 to 6 m²/cm³.

12. A process for producing an electronic device, which comprises a step of preparing a first glass substrate having a surface having a first sealing region;
    a step of preparing a second glass substrate having a surface having a second sealing region corresponding to the first sealing region and provided with a sealing material layer having a thickness of at most 15 μm formed on the second sealing region;
    a step of laminating the first glass substrate and the second glass substrate with the sealing material layer interposed so that the surface of the first glass substrate and the surface of the second glass substrate are opposed to each other; and
    a step of irradiating the sealing material layer with a laser light through the first glass substrate or the second glass substrate to melt the sealing material layer thereby to form a sealing layer to seal the electronic element portion provided between the first glass substrate and the second glass substrate;
    wherein the sealing material layer comprises a fired material of a glass material for sealing containing a sealing glass, a laser absorbent and optionally a low-expansion filler, the total content of the laser absorbent and the low-expansion filler being an optional component being within the range of from 2 to 44 vol %; and
    wherein the difference of the thermal expansion coefficient $\alpha_1$ of the sealing material layer from the thermal expansion coefficient $\alpha_2$ of at least one of the first glass substrate and the second glass substrate is within the range of from 15 to 65($\times 10^{-7}$/° C.).

13. The process for producing an electronic device according to claim 12, wherein the difference of each of the thermal expansion coefficient $\alpha_{21}$ of the first glass substrate and the thermal expansion coefficient $\alpha_{22}$ of the second glass substrate from the thermal expansion coefficient $\alpha_1$ of the material of the sealing layer is within the range of from 15 to $65(\times10^{-7}/°C.)$.

14. The process for producing an electronic device according to claim 12, wherein the difference of either one of a thermal expansion coefficient $\alpha_{21}$ of the first glass substrate and a thermal expansion coefficient $\alpha_{22}$ of the second glass substrate from the thermal expansion coefficient $\alpha_1$ of the material of the sealing layer is within the range of from 15 to $65(\times10^-/°C.)$, and the difference of the other one of the thermal expansion coefficients from the thermal expansion coefficient $\alpha_1$ of the material of the sealing layer is less than $15\times10^{-7}/°C$.

15. The process for producing an electronic device according to claim 12, wherein the total surface area of the laser absorbent and the low-expansion filler in the glass material for sealing is within the range of from 0.5 to 6 $m^2/cm^3$.

* * * * *